United States Patent
Lee et al.

(10) Patent No.: US 11,543,914 B2
(45) Date of Patent: Jan. 3, 2023

(54) INPUT SENSING DEVICE AND DISPLAY DEVICE HAVING THE SAME

(71) Applicant: SAMSUNG DISPLAY CO., LTD., Yongin-si (KR)

(72) Inventors: Choon Hyop Lee, Yongin-si (KR); Jang Hui Kim, Yongin-si (KR); Jae Won Kim, Yongin-si (KR); In Nam Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/711,594

(22) Filed: Apr. 1, 2022

(65) Prior Publication Data

US 2022/0326832 A1    Oct. 13, 2022

(30) Foreign Application Priority Data

Apr. 8, 2021 (KR) .......................... 10-2021-0045922

(51) Int. Cl.
*G06F 3/041* (2006.01)
*G06F 3/044* (2006.01)
*H03M 1/18* (2006.01)

(52) U.S. Cl.
CPC .......... *G06F 3/04166* (2019.05); *G06F 3/044* (2013.01); *G06F 3/04164* (2019.05); *H03M 1/18* (2013.01)

(58) Field of Classification Search
CPC .. G06F 3/04166; G06F 3/04164; G06F 3/044; H03M 1/18
See application file for complete search history.

(56) References Cited

U.S. PATENT DOCUMENTS

| | | | |
|---|---|---|---|
| 10,254,894 B2 | 4/2019 | Nathan et al. | |
| 2017/0205933 A1* | 7/2017 | Kwon | G06V 40/1306 |
| 2019/0324572 A1* | 10/2019 | Tan | G06F 3/044 |
| 2019/0339803 A1* | 11/2019 | Park | G06F 3/044 |
| 2021/0313401 A1 | 10/2021 | Lee et al. | |
| 2022/0057898 A1 | 2/2022 | Lee et al. | |

FOREIGN PATENT DOCUMENTS

| | | |
|---|---|---|
| JP | 6756832 | 9/2020 |
| KR | 10-2021-0123454 | 10/2021 |
| KR | 10-2022-0023878 | 3/2022 |

* cited by examiner

*Primary Examiner* — Hong Zhou
(74) *Attorney, Agent, or Firm* — F. Chau & Associates, LLC

(57) ABSTRACT

An input sensing device includes driving electrodes and sensing electrodes, and an analog front-end which processes sensing signals from the sensing electrodes to output a differential output value. The analog front-end includes a first charge amplifier which differentially amplifies first and second sensing signals from two sensing electrodes to first and second input terminals, thus outputting first and second differential signals through first and second output terminals, a second charge amplifier which differentially amplifies the first and second differential signals, thus outputting third and fourth differential signals, a first demodulation circuit which filters the first and second differential signals in a first mode and filters each of the third and fourth differential signals in a second mode, and a first analog-to-digital converter which outputs a first sensing value based on at least one output signal of the first demodulation circuit.

20 Claims, 23 Drawing Sheets

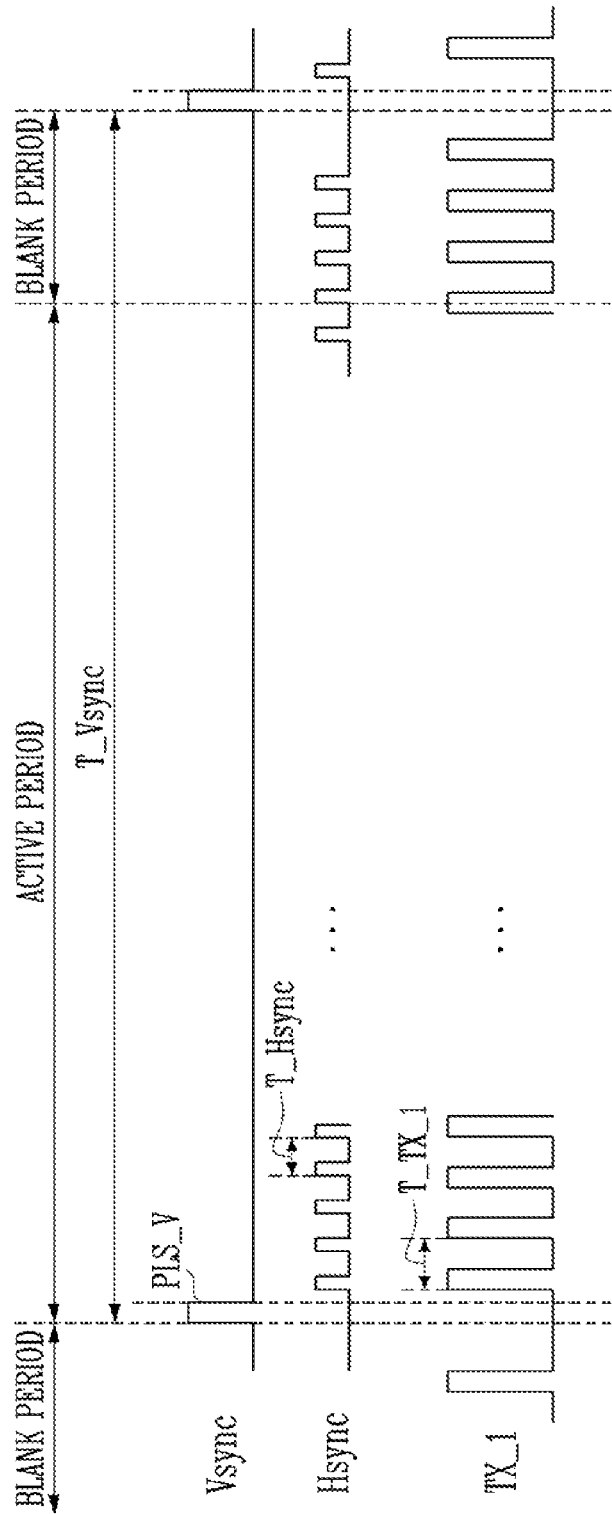

INPUT SENSING DEVICE AND DISPLAY DEVICE HAVING THE SAME

CROSS-REFERENCE TO RELATED APPLICATIONS

This application claims priority under 35 U.S.C. § 119 to Korean Patent Application No. 10-2021-0045922, filed on Apr. 8, 2021, the entire disclosure of which is incorporated by reference herein in its entirety.

TECHNICAL FIELD

Various embodiments of the present disclosure relate to an input sensing device and a display device having the input sensing device.

DISCUSSION OF RELATED ART

A display device may include a display panel that displays an image, and a touch panel that is disposed on the display panel that receives a touch input.

The touch panel may include a plurality of sensing electrodes, and may determine a touched point by sensing a change in capacitance formed on a plurality of touch electrodes.

SUMMARY

A display driving signal for driving a display panel may act on a touch panel as noise. As a result, a driving signal for driving the touch panel may be set to avoid the display driving signal (e.g., a horizontal synchronization signal).

However, with high-speed driving of the display device, the frequency of the display driving signal may increase. For example, the driving speed may increase from about 60 Hz to about 120 Hz. In other words, a period of the display driving signal may be reduced. In response to the increase in frequency, the period of the driving signal may be reduced, and time for touch sensing may be reduced.

Furthermore, as the display device become thinner and larger, a distance between the display panel and the touch panel (or touch electrodes) may be reduced, and an overlapping area between the display panel and the touch panel may be increased. As a result, parasitic capacitance may be increased and sensing sensitivity may be degraded.

Various embodiments of the present disclosure are directed to an input sensing device having increased sensing sensitivity even in an environment in which the performance of a touch sensor is deteriorated (e.g., an environment resulting from high-speed driving, thinning, and enlargement of the display device), and a display device having the input sensing device.

An embodiment of the present disclosure may provide an input sensing device, including driving electrodes and sensing electrodes; an analog front-end configured to process sensing signals provided from the sensing electrodes to output a differential output value; and a signal processor configured to sense an external input based on the differential output value. The analog front-end may include a first charge amplifier configured to differentially amplify a first sensing signal and a second sensing signal provided from two sensing electrodes among the sensing electrodes to first and second input terminals, thus outputting a first differential signal and a second differential signal through first and second output terminals; a second charge amplifier configured to differentially amplify the first differential signal and the second differential signal, thus outputting third and fourth differential signals; a first demodulation circuit configured to filter each of the first and second differential signals in a first mode, and to filter each of the third and fourth differential signals in a second mode; and a first analog-to-digital converter configured to output a first sensing value based on at least one output signal of the first demodulation circuit.

In an embodiment, the analog front-end may further include a first switching component coupled between the first and second output terminals of the first charge amplifier and the first demodulation circuit, and configured to be turned on in the first mode; and a second switching component coupled between the first and second output terminals of the first charge amplifier and third and fourth input terminals of the second charge amplifier, and configured to be turned on in the second mode.

In an embodiment, the first switching component may include a first switch coupled between the first output terminal of the first charge amplifier and a first input terminal of the first demodulation circuit; and a second switch coupled between the second output terminal of the first charge amplifier and a second input terminal of the first demodulation circuit.

In an embodiment, the second switching component may include a third switch coupled between the first output terminal of the first charge amplifier and a first input terminal of the second charge amplifier; and a fourth switch coupled between the second output terminal of the first charge amplifier and a second input terminal of the second charge amplifier.

In an embodiment, the analog front-end may further include a second demodulation circuit configured to filter one of outputs of the second charge amplifier in a third mode; and a second analog-to-digital converter configured to output a second sensing value corresponding to an output signal of the second demodulation circuit. The second output terminal of the first charge amplifier may be coupled to the second charge amplifier through the second switching component in the third mode.

In an embodiment, the analog front-end may further include a fifth switch coupled between a second output terminal of the second charge amplifier and the second demodulation circuit, and configured to be turned on in the third mode; and a sixth switch coupled between the second output terminal of the second charge amplifier and the first demodulation circuit, and configured to be turned on in the second mode and turned off in the third mode.

In an embodiment, in the third mode, the first output terminal of the first charge amplifier may be coupled to the first input terminal of the first demodulation circuit through the first switching component, the first demodulation circuit may filter the first differential signal, and the first analog-to-digital converter may output the first sensing value corresponding to the filtered first differential signal.

In an embodiment, the analog front-end may further include a multiplexer configured to select two of three sensing electrodes adjacent to each other among the sensing electrodes and thereby couple the selected sensing electrodes to the first and second input terminals of the first charge amplifier.

In an embodiment, the analog front-end may further include a second demodulation circuit configured to filter one of outputs of the second charge amplifier in the third mode; a second analog-to-digital converter configured to output a second sensing value corresponding to an output signal of the second demodulation circuit; and a fourth switching component configured to couple one of the two sensing electrodes to one of the input terminals of the second charge amplifier, in the third mode.

In an embodiment, in the third mode, the second switching component may be turned off, the first output terminal of the first charge amplifier is coupled to the first input terminal of the first demodulation circuit through the first switching component, the first demodulation circuit may filter the first differential signal, and the first analog-to-digital converter may output the first sensing value corresponding to the filtered first differential signal.

An embodiment of the present disclosure may provide an input sensing device, including driving electrodes and sensing electrodes; an analog front-end configured to process sensing signals provided from the sensing electrodes to output a differential output value; and a signal processor configured to sense an external input based on the differential output value. The analog front-end may include a first charge amplifier configured to differentially amplify a first sensing signal and a second sensing signal provided from two sensing electrodes among the sensing electrodes to first and second input terminals, thus outputting a first differential signal and a second differential signal through first and second output terminals; a first demodulation circuit configured to filter each of the first and second differential signals in a first mode, and to filter the first differential signal in a second mode; and a first analog-to-digital converter configured to output a first sensing value based on at least one output signal of the first demodulation circuit; and a second analog-to-digital converter configured to output a second sensing value corresponding to the second differential signal in the second mode.

In an embodiment, the first analog-to-digital converter may output the first sensing value corresponding to a difference between the first and second differential signals in the first mode, and may output the first sensing value corresponding to the first differential signal in the second mode.

In an embodiment, the analog front-end may further include a second charge amplifier configured to amplify and output the second differential signal in the second mode, and the second analog-to-digital converter may output the second sensing value corresponding to an output of the second charge amplifier.

In an embodiment, the analog front-end may further include a second demodulation circuit configured to filter the output of the second charge amplifier, and the second analog-to-digital converter may output the second sensing value corresponding to an output of the second demodulation circuit.

An embodiment of the present disclosure may provide a display device, including a display panel including light-emitting pixels; driving electrodes and sensing electrodes disposed on a surface of the display panel; an analog front-end configured to process sensing signals provided from the sensing electrodes to output a differential output value; and a signal processor configured to sense an external input based on the differential output value. The analog front-end may include a first charge amplifier configured to differentially amplify a first sensing signal and a second sensing signal provided from two sensing electrodes among the sensing electrodes to first and second input terminals, thus outputting a first differential signal and a second differential signal through first and second output terminals; a second charge amplifier configured to differentially amplify the first differential signal and the second differential signal, thus outputting third and fourth differential signals; a first demodulation circuit configured to filter each of the first and second differential signals in a first mode, and to filter each of the third and fourth differential signals in a second mode; and a first analog-to-digital converter configured to output a first sensing value based on output signals of the first demodulation circuit.

In an embodiment, the display panel may further include a base layer; a light emitting element formed on the base layer and forming each of the pixels; and a thin-film encapsulation layer covering the light emitting element. The driving electrodes or the sensing electrodes may be directly formed on the thin-film encapsulation layer.

In an embodiment, the analog front-end may further include a first switching component coupled between the first and second output terminals of the first charge amplifier and the first demodulation circuit, and configured to be turned on in the first mode; and a second switching component coupled between the first and second output terminals of the first charge amplifier and third and fourth input terminals of the second charge amplifier, and configured to be turned on in the second mode.

In an embodiment, the analog front-end may further include a second demodulation circuit configured to filter one of outputs of the second charge amplifier in a third mode; and a second analog-to-digital converter configured to output a second sensing value corresponding to an output signal of the second demodulation circuit. The second output terminal of the first charge amplifier may be coupled to the second charge amplifier through the second switching component in the third mode.

In an embodiment, the analog front-end may further include a multiplexer configured to select two of three sensing electrodes adjacent to each other among the sensing electrodes and thereby couple the selected sensing electrodes to the first and second input terminals of the first charge amplifier.

In an embodiment, the analog front-end may further include a second demodulation circuit configured to filter one of outputs of the second charge amplifier in the third mode; a second analog-to-digital converter configured to output a second sensing value corresponding to an output signal of the second demodulation circuit; and a third switching component configured to couple one of the two sensing electrodes to one of the input terminals of the second charge amplifier, in the third mode.

BRIEF DESCRIPTION OF THE DRAWINGS

The above and other features of the present disclosure will become more apparent by describing in detail embodiments thereof with reference to the accompanying drawings, in which:

FIGS. 7A, 7B, and 7C are waveform diagrams for explaining an operation of a driving signal generator included in the input sensing circuit of FIG. 6A, in accordance with embodiments of the present disclosure.

DETAILED DESCRIPTION

Figure 1:
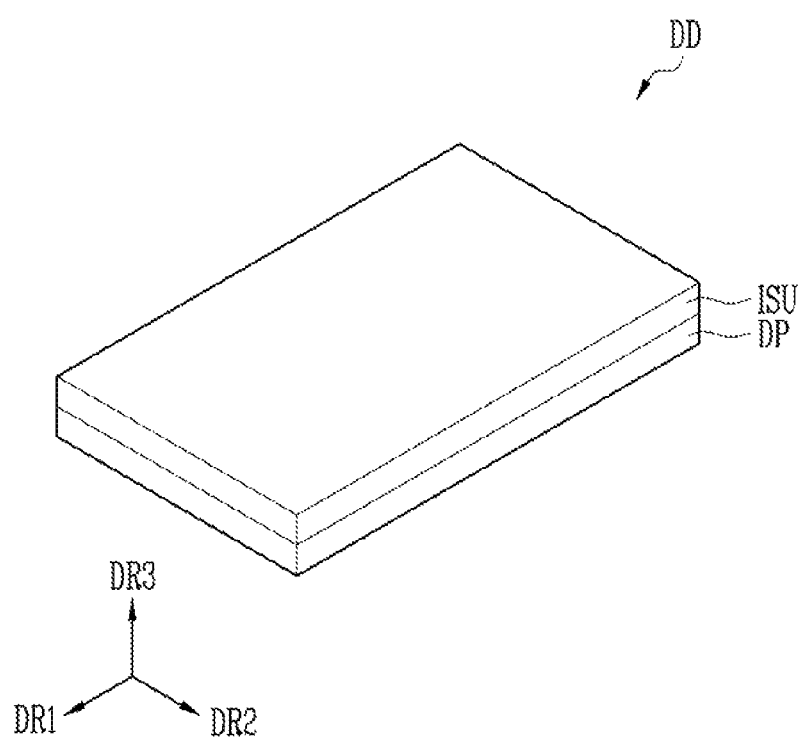
FIG. 1 is a perspective view illustrating a display device in accordance with embodiments of the present disclosure.

Embodiments of the present disclosure will be described more fully hereinafter with reference to the accompanying drawings. Like reference numerals may refer to like elements throughout the accompanying drawings, and repetitive explanations may be omitted.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

Some elements which are not directly related to the features of the present disclosure in the drawings may be omitted to clearly illustrate the present disclosure.

FIG. 1 is a perspective view illustrating a display device in accordance with embodiments of the present disclosure.

Referring to FIG. 1, the display device DD may be provided in various forms, for example, in the form of a rectangular plate having two pairs of parallel sides. In a case in which the display device DD is provided in the form of a rectangular plate, one pair of sides of the two pairs of sides may be longer than the other.

The display device DD may display an image through a display surface. The display surface may be parallel to a surface defined by a first direction axis corresponding to a first direction DR1 and a second direction axis corresponding to a second direction DR2. A normal direction of the display surface, namely, a thickness direction of the display device DD, will be defined as a third direction DR3.

A front surface (or an upper surface) and a rear surface (or a lower surface) of each of members, layers, or units, which will be described herein below, may be separated in the third direction DR3. However, the first to third direction DR1, DR2, and DR3 are only examples, and the first to third direction DR1, DR2, and DR3 may be changed to other directions in embodiments.

The display device DD may have a flat display surface. However, the present disclosure is not limited thereto. For example, the display device DD may include any one of various display surfaces capable of displaying an image, e.g., a curved display surface or a three-dimensional display surface. In a case in which the display device DD in accordance with an embodiment of the present disclosure has a three-dimensional display surface, for example, the three-dimensional display surface may include a plurality of display areas oriented in different directions. The three-dimensional display surface may be embodied in the form of a polygonal-column-shaped display surface.

The display device DD may be a flexible display device. For example, the display device DD may be applied to a foldable display device, a bendable display device, a rollable display device, etc. However, the present disclosure is not limited thereto. For example, according to embodiments, and the display device DD may be a rigid display device.

The display device DD may be applied to large-sized electronic devices such as, for example, a television, a monitor, or an electronic display board, and small- and medium-sized electronic devices such as a mobile phone, a tablet, a navigation device, a game console, or a smartwatch. Furthermore, the display device DD may be applied to a wearable electronic device such as a head-mounted display (HMD).

The display device DD may include a display panel DP and an input sensing unit ISU (or input sensing layer, input sensing panel, or input sensing device).

The display panel DP and the input sensing unit ISU may be formed by a continuous process. However, the display panel DP and the input sensing unit ISU are not limited thereto. For example, the display panel DP and the input sensing unit ISU may be coupled to each other via an adhesive member. The adhesive member may contain common adhesive or glue. For example, the adhesive member may be an optical transparent adhesive member.

A corresponding component formed with another component through a continuous process may be expressed as a "layer", and a component coupled to another component through the adhesive member may be expressed as a "panel". The "panel" includes a base layer, e.g., a synthetic resin film, a composite material film, or a glass substrate, for providing a base surface, but the "layer" may omit a base layer. In other words, the input sensing unit ISU expressed as the "layer" may be directly disposed or formed on the display panel DP (or the base surface provided by the display panel DP).

The input sensing unit ISU may sense external input such as, for example, physical touch or hovering relative to the display surface of the display device DD by an external medium such as, for example, a hand or a pen.

The display panel DP may be a light emitting display panel. For example, the display panel DP may be an organic light-emitting display panel or a quantum dot light-emitting display panel.

In an embodiment, the display device DD may further include a reflection preventing panel or a window panel.

The reflection preventing panel may be disposed on the input sensing unit ISU to reduce reflectance of external light that is incident on the display surface of the display device DD from an external device. For example, the reflection preventing panel may include color filters. The color filters may have a predetermined arrangement. The arrangement of the color filters may be determined in consideration of emission colors of pixels included in the display panel DP.

A window panel may be disposed on the input sensing unit ISU to protect the display panel DP and the input sensing unit ISU from external shocks. The window panel may include a synthetic resin film and/or a glass substrate. The window panel may include two or more films coupled to each other by the adhesive member.

Figure 2:
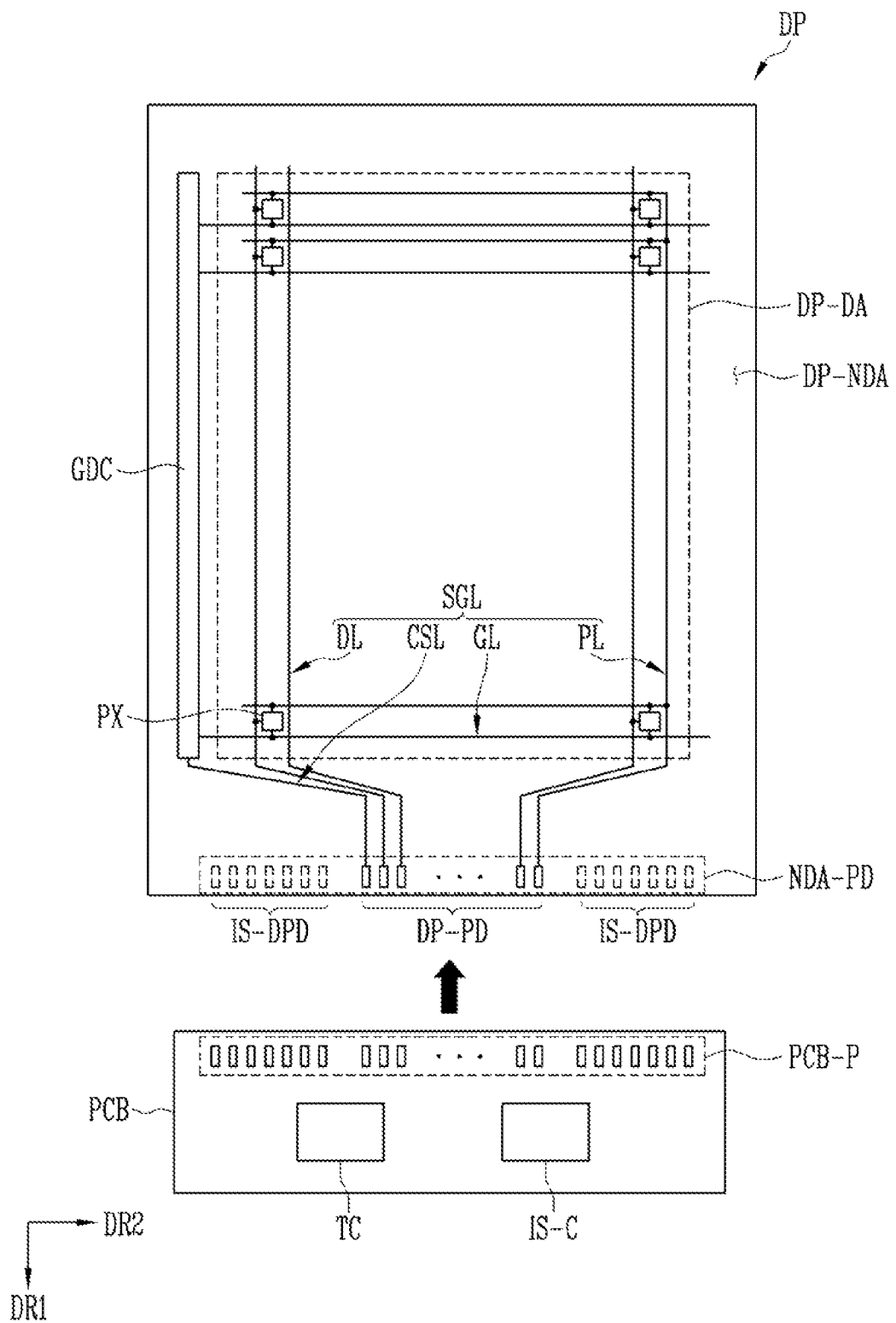
FIG. 2 is a plan view illustrating an example of a display panel included in the display device of FIG. 1 in accordance with embodiments of the present disclosure.

FIG. 2 is a plan view illustrating an example of a display panel included in the display device of FIG. 1 in accordance with embodiments of the present disclosure.

Referring to FIGS. 1 and 2, the display panel DP may include a display area DP-DA in which an image is displayed, and a non-display area DP-NDA adjacent to the display area DP-DA. The non-display area DP-NDA is an area in which an image is not displayed. The non-display area DP-NDA may be disposed outside the display area DP-DA.

The display area DP-DA may include pixel areas having pixels PX. A pad component having pads of lines may be provided in the non-display area DP-NDA. A data driver may be provided in the non-display area DP-NDA to provide data signals to the pixels PX. The data driver may provide the data signals to the pixels PX through data lines. The data driver may be included in a timing control circuit TC that will be described later.

The display panel DP may include a driving circuit GDC, signal lines SGL, signal pads DP-PD, and pixels PX.

The pixels PX may be disposed in the display area DP-DA. Each of the pixels PX may include a light emitting element, and a pixel driving circuit coupled to the light emitting element. For example, the light emitting element may be composed of an organic light emitting diode or an inorganic light emitting diode such as a micro light emitting diode (LED) or a quantum dot light emitting diode. Further, the light emitting element may be a light emitting element in which an organic material and an inorganic material are combined. Moreover, each of the pixels PX may include a single light emitting element. In an embodiment, each of the pixels PX may include a plurality of light emitting elements. The light emitting elements may be coupled in series, parallel, or series-parallel to each other.

The driving circuit GDC may include a scan driving circuit. The scan driving circuit may generate scan signals, and sequentially provide or output the scan signals to scan lines GL. The scan driving circuit may further provide another control signal to the driving circuit of the pixels PX.

The scan driving circuit may include thin film transistors formed through the same process as that of the driving circuit of each pixel PX, e.g., through a low temperature polycrystalline silicon (LTPS) process or a low temperature polycrystalline oxide (LTPO) process.

The signal lines SGL may include scan lines GL, data lines DL, a power line PL, and a control signal line CSL. Each of the scan lines GL may be coupled to a corresponding pixel among the pixels PX, and each of the data lines DL may be coupled to a corresponding pixel among the pixels PX. The power line PL may be coupled to the pixels PX. The control signal line CSL may provide control signals to the scan driving circuit.

The signal lines SGL may overlap the display area DP-DA and the non-display area DP-NDA. The signal lines SGL may include a pad component (or pad portion) and a line component (or line portion). The line component may overlap the display area DP-DA and the non-display area DP-NDA. The pad component may be coupled to an end of the line component. The pad component may be disposed in the non-display area DP-NDA and overlap a corresponding one of the signal pads DP-PD. In the non-display area DP-NDA, an area in which the signal pads DP-PD are disposed may be defined as a pad area NDA-PD.

The line component coupled to the pixels PX may form most of the signal lines SGL. The line component may be coupled to transistors of the pixels PX. The line component may have a single-layer or multilayer structure. The line component may be formed of a single body or two or more bodies. The two or more bodies may be disposed on different layers and coupled to each other through a contact hole that passes through an insulating layer disposed between the two or more bodies.

The display panel DP may further include dummy pads IS-DPD disposed in the pad area NDA-PD. The dummy pads IS-DPD may be formed through the same process as that of the signal lines SGL and, thus, disposed on the same layer as the signal lines SGL. The dummy pads IS-DPD may be selectively provided in the display device DD including the input sensing layer, and may be omitted in the display device DD including the input sensing panel.

In FIG. 2, there is further illustrated a printed circuit board PCB that is electrically coupled to the display panel DP. The printed circuit board PCB may be a flexible circuit board or a rigid circuit board. The printed circuit board PCB may be directly coupled to the display panel DP, or may be coupled to the display panel DP through another printed circuit board.

A timing control circuit TC configured to control the operation of the display panel DP may be disposed on the circuit board PCB. The timing control circuit TC may receive input image data and timing signals (e.g., a vertical synchronization signal, a horizontal synchronization signal, clock signals) from an external device (e.g., a host system such as an application processor), generate a gate driving control signal for controlling the driving circuit GDC based on the timing signals, and provide the gate driving control signal to the driving circuit GDC. Of the timing signals, the vertical synchronization signal may define the start of one display section (or one frame) on which an image of one frame (or frame image) is displayed, or the start (or start of transmission) of image data corresponding to one frame. Of the timing signals, the horizontal synchronization signal may define a section on which each of images (e.g., line image displayed through the pixels included in the same row) of the horizontal line included in the image of one frame is output. Furthermore, the timing control circuit TC may generate a data driving control signal for controlling the data driver, provide the data driving control signal to the data driver, and rearrange input image data to provide the rearranged data to the data driver.

Furthermore, an input sensing circuit IS-C configured to control the input sensing unit ISU may be disposed on the printed circuit board PCB. The input sensing circuit IS-C may receive the timing signal (e.g., a vertical synchronization signal) from the external device (e.g., a host system such as the application processor), and generate a driving signal (or a touch driving signal) based on the vertical synchronization signal. Furthermore, the input sensing circuit may receive a sensing signal corresponding to external input (e.g., a user's touch input) from the input sensing unit ISU, and calculate or recognize the location of the external input (e.g., a touch input) based on a sensing signal.

Each of the timing control circuit TC and the input sensing circuit IS-C may be mounted on the printed circuit board PCB in the form of an integrated chip. In an embodiment, the timing control circuit TC and the input sensing circuit IS-C may be mounted on the printed circuit board PCB in the form of a single integrated chip. The printed circuit board PCB may include circuit board pads PCB-P which are electrically coupled to the display panel DP. The printed circuit board PCB may further include signal lines that couple the circuit board pads PCB-P with the timing control circuit TC and/or the input sensing circuit IS-C.

Figure 3:
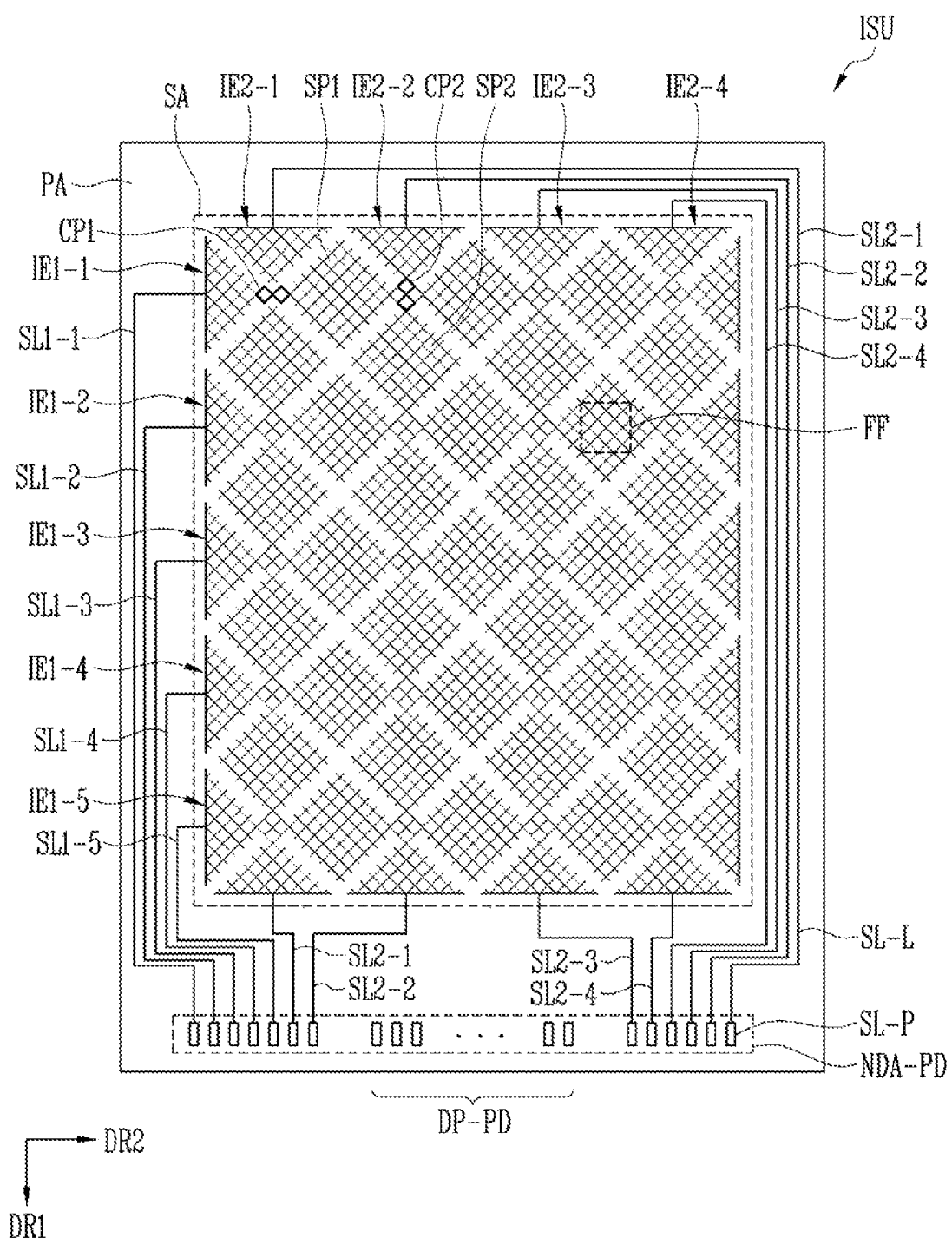
FIG. 3 is a plan view illustrating an example of an input sensing unit included in the display device of FIG. 1 in accordance with embodiments of the present disclosure.
Figure 4:
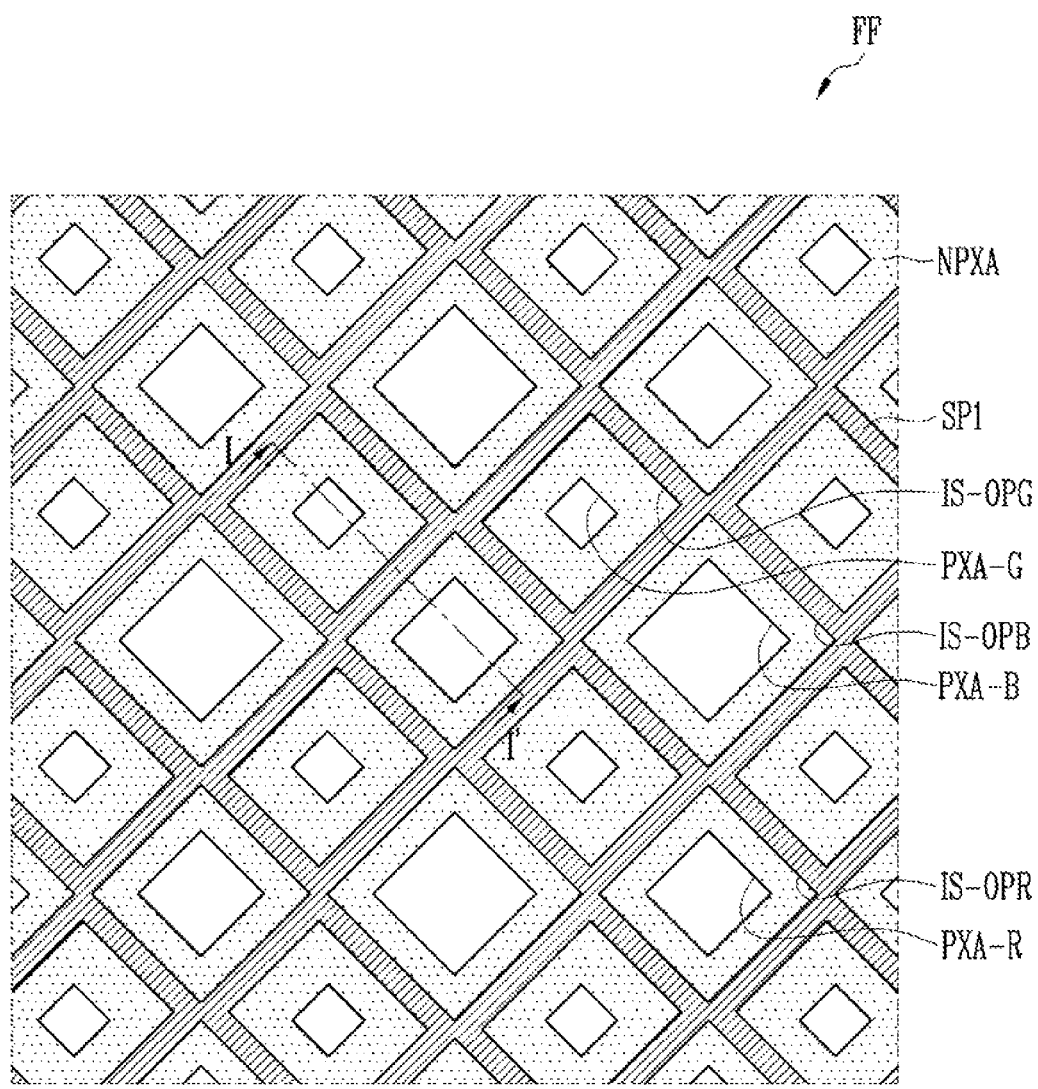
FIG. 4 is an enlarged plan view illustrating a first area of the input sensing unit of FIG. 3 in accordance with embodiments of the present disclosure.

FIG. 3 is a plan view illustrating an example of an input sensing unit included in the display device of FIG. 1 in accordance with embodiments of the present disclosure. FIG. 4 is an enlarged plan view illustrating a first area (FF) of the input sensing unit of FIG. 3 in accordance with embodiments of the present disclosure.

Referring to FIGS. 2 and 3, the input sensing unit ISU may include a sensing area SA configured to sense external input, e.g., a user's touch and/or a touch pressure, and a peripheral area PA provided on at least one side of the sensing area SA.

The sensing area SA may correspond to the display area DP-DA of the display panel DP and have a surface area that is substantially equal to or greater than that of the display area DP-DA. The peripheral area PA may be disposed adjacent to the sensing area SA. Furthermore, the peripheral area PA may correspond to the non-display area DP-NDA of the display panel DP.

The input sensing unit ISU may include first sensing electrodes IE1-1 to IE1-5 (or driving electrodes) and second sensing electrodes IE2-1 to IE2-4 (or sensing electrodes) which are provided in the sensing area SA, and first signal lines SL1-1 to SL1-5 and second signal lines SL2-1 to SL2-4 which are provided in the peripheral area PA. For example, according to embodiments, the first sensing electrodes IE1-1 to IE1-5 may be referred to as a plurality of driving electrodes, and the second sensing electrodes IE2-1 to IE2-4 may be referred to as a plurality of sensing electrodes.

In each first sensing electrode, first sensors SP1 may be arranged in the second direction DR2. In each second sensing electrode, the second sensors SP2 may be arranged in the first direction DR1. Each of first connectors CP1 may couple the corresponding adjacent first sensors SP1 to each other. Each of second connectors CP2 may couple the corresponding adjacent second sensors SP2 to each other.

The first sensing electrodes IE1-1 to IE1-5 and the second sensing electrodes IE2-1 to IE2-5 may have a mesh pattern or a mesh structure. As illustrated in FIG. 4, the mesh pattern may include mesh lines that are metal lines forming at least one mesh hole (or aperture) IS-OPR, IS-OPG, and IS-OPB. Each of the mesh holes IS-OPR, IS-OPG, and IS-OPB may have the shape of a diamond plane by the mesh lines, but the present disclosure is not limited thereto.

Since each of the first sensing electrodes IE1-1 to IE1-5 and the second sensing electrodes IE2-1 to IE2-4 has a mesh pattern, a parasitic capacitance between it and the electrodes of the display panel DP may be reduced.

Furthermore, as illustrated in FIG. 4, in an embodiment, in the first area FF, the first sensing electrodes IE1-1 to IE1-5 and the second sensing electrodes IE2-1 to IE2-4 do not overlap emission areas PXA-R, PXA-G, and PXA-B. Here, the emission areas PXA-R, PXA-G, and PXA-B may be areas from which light is emitted, and may be included, respectively, in the pixels PX (or pixel areas in which the pixels PX are provided) described with reference to FIG. 2. Thus, according to embodiments, the first sensing electrodes IE1-1 to IE1-5 and the second sensing electrodes IE2-1 to IE2-4 are not visually recognized by a user of the display device DD.

Each of the first sensing electrodes IE1-1 to IE1-5 and the second sensing electrodes IE2-1 to IE2-4 may include, for example, aluminum, copper, chrome, nickel, titanium, etc. In an embodiment, the first sensing electrodes IE1-1 to IE1-5 and the second sensing electrodes IE2-1 to IE2-4 may have a three-layer structure of titanium/aluminum/titanium. However, the present disclosure is not limited thereto, and the sensing electrodes may be made of various metals.

For example, in a case in which the first sensing electrodes IE1-1 to IE1-5 and the second sensing electrodes IE2-1 to IE2-4 are formed of metal capable of using a low temperature process, the light emitting element may be prevented from being damaged even when the input sensing unit ISU is formed through a continuous process after a process of manufacturing the display panel DP.

In a case in which the first sensing electrodes IE1-1 to IE1-5 and the second sensing electrodes IE2-1 to IE2-4 are directly formed in a mesh pattern on the display panel DP, the flexibility of the display device DD may be increased.

Although it is illustrated in FIG. 3 that the first sensing electrodes IE1-1 to IE1-5 and the second sensing electrodes IE2-1 to IE2-4 include the first sensors SP1 and the second sensors SP2 each having a diamond shape, the present disclosure is not limited thereto. For example, the first and second sensors SP1 and SP2 may have other polygonal shapes. Each of the first sensing electrodes IE1-1 to IE1-5 and the second sensing electrodes IE2-1 to IE2-4 may have a shape (e.g., a bar shape) in which the sensors and the connectors are not distinct from each other.

The first signal lines SL1-1 to SL1-5 may be coupled to first ends of the first sensing electrodes IE1-1 to IE1-5, respectively. The second signal lines SL2-1 to SL2-4 may be coupled to both ends of the respective second sensing electrodes IE2-1 to IE2-4. However, the present disclosure is not limited thereto. For example, in an embodiment, the first signal lines SL1-1 to SL1-5 may be coupled to both ends of the first sensing electrodes IE1-1 to IE1-5. In an embodiment, the second signal lines SL2-1 to SL2-4 may be coupled to only first ends of the second sensing electrodes IE2-1 to IE2-4, respectively.

Because the second sensing electrodes IE2-1 to IE2-4 are longer than the first sensing electrodes IE1-1 to IE1-5, drop or attenuation of a sensing signal (or a detection signal, a transmitting signal) may be increased, whereby the sensing sensitivity may be reduced. Since the sensing signal is transmitted through the second signal lines SL2-1 to SL2-4 coupled to both ends of the respective second sensing electrodes IE2-1 to IE2-4, the drop of the sensing signal and the reduction in the sensing sensitivity may be prevented.

Each of the first and second signal lines SL1-1 to SL1-5 and SL2-1 to SL2-4 may include a line component SL-L and a pad component SL-P. The pad component SL-P may be arranged in the pad area NDA-PD. The pad component SL-P may overlap the dummy pads IS-DPD shown in FIG. 2.

The input sensing unit ISU may include signal pads DP-PD. The signal pads DP-PD may be arranged in the pad area NDA-PD.

Referring to FIG. 4, in an embodiment, the first sensors SP1 do not overlap the emission areas PXA-R, PXA-G, and PXA-B, but may overlap the non-emission area NPXA.

Mesh lines (e.g., metal lines) of the first sensors SP1 may define mesh holes IS-OPR, IS-OPG, and IS-OPB. The mesh holes IS-OPR, IS-OPG, and IS-OPB may form one-to-one correspondence with the emission areas PXA-R, PXA-G, and PXA-B. The emission areas PXA-R, PXA-G, and PXA-B may be exposed through the mesh holes IS-OPR, IS-OPG, and IS-OPB.

A width of each of the mesh lines may be smaller than a width of a pixel defining layer (e.g., pixel defining layer defining the emission areas PXA-R, PXA-G, and PXA-B) corresponding to the non-emission area NPXA.

Thus, according to embodiments of the present disclosure, the blocking of light emitted from the emission areas PXA-R, PXA-G, and PXA-B by the mesh lines may be reduced or minimized, and the mesh lines may be prevented from being visually recognized by a user.

The emission areas PXA-R, PXA-G, and PXA-B may be classified into a plurality of groups according to the color of light generated from the light emitting element. In FIG. 4, there is illustrated an example in which the emission areas PXA-R, PXA-G, and PXA-B are classified into three groups according to the emission color.

The emission areas PXA-R, PXA-G, and PXA-B may have different areas according to the color of light emitted from the light emitting element. For example, when the light emitting element includes an organic light-emitting diode, the surface area of each emission area PXA-R, PXA-G PXA-B may be determined according to the type of the organic light-emitting diode.

The mesh holes IS-OPR, IS-OPG, IS-OPB may be classified into a plurality of groups having different surface areas. The mesh holes IS-OPR, IS-OPG, and IS-OPB may be classified into three groups according to the corresponding emission areas PXA-R, PXA-G, and PXA-B.

Although it is illustrated in FIG. 4 that the mesh holes IS-OPR, IS-OPG, and IS-OPB form one-to-one correspondence with the emission areas PXA-R, PXA-G, and PXA-B, the present disclosure is not limited thereto. For example, according to embodiments, each of the mesh holes IS-OPR, IS-OPG, and IS-OPB may correspond to two or more emission areas PXA-R, PXA-G or PXA-B.

Although it is illustrated in FIG. 4 that the emission areas PXA-R, PXA-G and PXA-B have various surface areas, this is illustrative and the present disclosure is not limited thereto. For example, according to embodiments, the emission areas PXA-R, PXA-G and PXA-B may have the same size, and the mesh holes IS-OPR, IS-OPG, and IS-OPB may also have the same size. The plane shape of each of the mesh holes IS-OPR, IS-OPG, and IS-OPB is not limited, and the shape may be, for example, a diamond shape or other polygonal shapes. The plane shape of each of the mesh holes IS-OPR, IS-OPG and IS-OPB may be a polygonal shape having rounded corners.

Although it is illustrated in FIG. 3 that the input sensing unit ISU includes five first sensing electrodes IE1-1 to IE1-5 and four second sensing electrodes IE2-1 to IE2-4, the numbers of the first sensing electrodes IE1-1 to IE1-5 and the second sensing electrodes IE2-1 to IE2-4 are not limited thereto. For example, according to embodiments, the input sensing unit ISU may include six or more first sensing electrodes and/or five or more second sensing electrodes.

Figure 5:
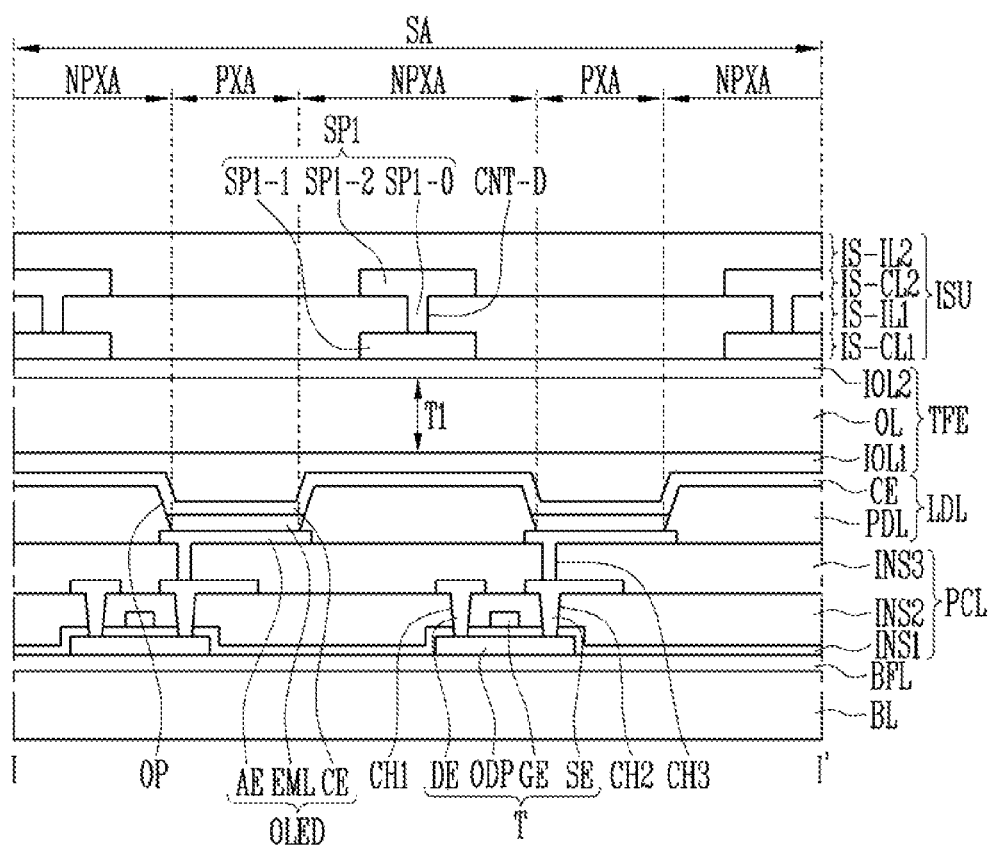
FIG. 5 is a cross-sectional view illustrating an example of the display device, taken along line I-I' of FIG. 4, in accordance with embodiments of the present disclosure.

FIG. 5 is a cross-sectional view illustrating an example of the display device, taken along line I-I' of FIG. 4, in accordance with embodiments of the present disclosure.

Referring to FIG. 5, the display device may include a base layer BL (or substrate), a buffer layer BFL, a pixel circuit layer PCL, a light emitting element layer LDL, a thin-film encapsulation layer TFE, and an input sensing unit ISU. In an embodiment, the first sensing electrodes IE1-1 to IE1-5 or the second sensing electrodes IE2-1 to IE2-4 are directly formed on the thin-film encapsulation layer TFE.

The base layer BL may include a synthetic resin film. The synthetic resin layer may be a polyimide-based resin layer, however, the material thereof is not limited to a particular material. The base layer BL may include, for example, a glass substrate, a metal substrate, an organic/inorganic composite material substrate, etc.

The buffer layer BFL may be provided on the base layer BL. The buffer layer BFL may prevent impurities from being diffused into a transistor T provided on the base layer BL, and increase the flatness of the base layer BL. The buffer layer BFL may be provided in a single layer structure or a multilayer structure having at least two or more layers. The buffer layer BFL may be an inorganic insulating layer formed of inorganic material. For example, the buffer layer BFL may be formed of silicon nitride, silicon oxide, silicon oxynitride, etc. In a case in which the buffer layer BFL has the multilayer structure, the respective layers may be formed of the same material or different materials. In some cases, the buffer layer BFL may be omitted.

The pixel circuit layer PCL may include at least one insulating layer and a circuit element. The insulating layer may include at least one inorganic layer and at least one organic layer. The circuit element may include, for example, a signal line, a driving circuit of a pixel, etc.

A semiconductor pattern ODP of the transistor T may be disposed on the buffer layer BFL. The semiconductor pattern ODP may include, for example, amorphous silicon, polysilicon, or metal oxide semiconductors.

A first insulating layer INS1 may be disposed on the semiconductor pattern ODP. The first insulating layer INS1 may be an inorganic insulating layer formed of inorganic material. For example, the first insulating layer INS1 may be formed of silicon nitride, silicon oxide, silicon oxynitride, etc.

A control electrode GE of the transistor T may be disposed on the first insulating layer INS1. The control electrode GE may be manufactured by the same photolithography process as that of the scan lines GL (see FIG. 2).

A second insulating layer INS2 may be disposed on the first insulating layer INS1 and may cover the control electrode GE. The second insulating layer INS2 may be an inorganic insulating layer formed of inorganic material. For example, the second insulating layer INS2 may be formed of silicon nitride, silicon oxide, silicon oxynitride, etc.

A first transistor electrode DE (or drain electrode) of the transistor T and a second transistor electrode SE (or source electrode) may be disposed on the second insulating layer INS2.

The first transistor electrode DE and the second transistor electrode SE may be coupled to the semiconductor pattern ODP, respectively, through a first through hole CH1 and a second through hole CH2 that are formed through the first insulating layer INS1 and the second insulating layer INS2. In an embodiment of the present disclosure, the transistor T may be embodied in a bottom gate structure.

A third insulating layer INS3 may be disposed on the second insulating layer INS2 and may cover the first transistor electrode DE and the second transistor electrode SE. The third insulating layer INS3 may provide a flat surface. The third insulating layer INS3 may be formed of an organic layer such as, for example, acryl resin, epoxy resin, phenolic resin, polyamide resin, or polyimide resin.

The light emitting element layer LDL may be disposed on the third insulating layer INS3. The light emitting element layer LDL may include a pixel defining layer PDL and a light emitting element OLED.

The pixel defining layer PDL may include organic material. A first electrode AE may be disposed on the third insulating layer INS3. The first electrode AE may be coupled to the second transistor electrode SE through a third through hole CH3 that is formed through the third insulating layer INS3. The pixel defining layer PDL may include an opening OP, and the opening OP may define the emission areas PXA-R, PXA-G and PXA-B. The opening OP of the pixel defining layer PDL may expose at least a portion of the first electrode AE. In an embodiment, the pixel defining layer PDL may be omitted.

The pixel PX (see FIG. 2) may be disposed in the display area DP-DA. The display area DP-DA may include an emission area PXA, and a non-emission area NPXA adjacent to the emission area PXA. The non-emission area NPXA may enclose the emission area PXA. The emission area PXA may be defined to correspond to a portion of the first electrode AE that is exposed through the opening OP. The non-emission area NPXA may be defined to correspond to the pixel defining layer PDL.

The light emitting element OLED may include a first electrode AE coupled to the second transistor electrode SE, a light-emitting layer EML disposed on the first electrode AE, and a second electrode CE disposed on the light-emitting layer EML. For example, the light emitting element OLED may be an organic light-emitting diode.

Any one of the first electrode AE and the second electrode CE may be an anode electrode, and the other may be a cathode electrode. For example, the first electrode AE may be an anode electrode, and the second electrode CE may be a cathode electrode.

At least one of the first electrode AE and the second electrode CE may be a transmissive electrode. For example, when the light emitting element OLED is a top-emission type organic light emitting element, the first electrode AE may be a reflective electrode, and the second electrode CE may be a transmissive electrode. For example, when a display element OLED is a bottom-emission type organic light emitting element, the first electrode AE may be a transmissive electrode, and the second electrode CE may be a reflective electrode. When the light emitting element OLED is a both-side emission type organic light emitting element, both the first electrode AE and the second electrode CE may be transmissive electrodes. In an embodiment, there is illustrated an example in which the light emitting element OLED is a top-emission type organic light emitting element and the first electrode AE is an anode electrode. However, the present disclosure is not limited thereto.

In each pixel area, the first electrode AE may be disposed on the third insulating layer INS3. The first electrode AE may include a reflective layer which reflects light, and a transparent conductive layer which is disposed over or under the reflective layer. At least one of the transparent conductive layer and the reflective layer may be coupled to the second transistor electrode SE.

The reflective layer may include material that is able to reflect light. For example, the reflective layer may include at least one of aluminum (Al), silver (Ag), chrome (Cr), molybdenum (Mo), platinum (Pt), nickel (Ni) or an alloy thereof.

The transparent conductive layer may include transparent conductive oxide. For example, the transparent conductive layer may include at least one transparent conductive oxide of an indium tin oxide (ITO), an indium zinc oxide (IZO), an aluminum zinc oxide (AZO), a gallium doped zinc oxide (GZO), a zinc tin oxide (ZTO), a gallium tin oxide (GTO) or a fluorine doped tin oxide (FTO).

The light-emitting layer EML may be disposed on the exposed surface of the first electrode AE. The light-emitting layer EML may have a multilayer thin-film structure including at least a light generation layer (LGL). For example, the light-emitting layer EML may include a hole injection layer (HIL) into which holes are injected, a hole transport layer (HTL) which has excellent hole transportation performance and restrains movement of electrons that have not been coupled with holes in the light generation layer, and thus, increases chances of recombination between holes and electrons, the light generation layer which emits light by recombination between injected electrons and holes, a hole blocking layer (HBL) which restrains movement of holes that have not been coupled with electrons in the light generation layer, an electron transport layer (ETL) which is provided to smoothly transport electrons to the light generation layer, and an electron injection layer (EIL) into which electrons are injected.

The color of light generated from the light generation layer may be one of, for example, red, green, blue and white. However, the present disclosure is not limited thereto. For example, the color of light generated from the light generation layer of the light-emitting layer EML may be one of magenta, cyan, and yellow according to embodiments.

The hole injection layer, the hole transport layer, the hole blocking layer, the electron transport layer, and the electron injection layer may be common layers coupled between adjacent pixel areas.

The second electrode CE may be disposed on the light-emitting layer EML. The second electrode CE may be a semi-transmissive reflective layer. For example, the second electrode CE may be a thin metal layer having a thickness allowing light to pass therethrough. The second electrode CE may allow some of the light generated from the light generation layer to pass therethrough, and may reflect the rest of the light generated from the light generation layer.

The second electrode CE may include material having a work function lower than that of the transparent conductive layer. For example, the second electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof.

Some of the light emitted from the light-emitting layer EML may not transmit through the second electrode CE, and light reflected by the second electrode CE may be reflected by the reflective layer again. That is, light emitted form the light-emitting layer EML may resonate between the reflective layer and the second electrode CE. The light extraction efficiency of the light emitting element (OLED) may be increased by the resonance of light.

The distance between the reflective layer and the second electrode CE may change depending on the color of light generated from the light generation layer. That is, depending on the color of light generated from the light generation layer, the distance between the reflective layer and the second electrode CE may be adjusted to correspond to a resonance distance.

The thin-film encapsulation layer TFE may be disposed on the second electrode CE. The thin-film encapsulation layer TFE may be disposed in common in the pixels PX. The thin-film encapsulation layer TFE may directly cover the second electrode CE. In an embodiment, an encapsulation layer that covers the second electrode CE may be further disposed between the thin-film encapsulation layer TFE and the second electrode CE. The thin-film encapsulation layer TFE may directly cover the encapsulation layer.

The thin-film encapsulation layer TFE may include a first encapsulation inorganic layer IOL1, an encapsulation organic layer OL, and a second encapsulation inorganic layer IOL2, which are sequentially stacked on the second electrode CE. The encapsulation inorganic layer may be formed of inorganic insulating material such as, for example, polysiloxane, silicon nitride, silicon oxide, or silicon oxynitride. The encapsulation organic layer may be formed of, for example, organic insulating material such as a polyacryl-based compound, a polyimide-based compound, a fluorocarbon compound such as Teflon, or a benzocyclobutene compound.

A thickness T1 of the thin-film encapsulation layer TFE (or encapsulation organic layer OL) may be adjusted to prevent the input sensing unit ISU from being affected by noise generated by components of the light emitting element layer LDL (or display panel). As the display device DD becomes thinner, a thickness T1 of the thin-film encapsulation layer TFE may be reduced (e.g., the thickness T1 is about 10 μm or less), and noise generated by components of the light emitting element layer LDL may affect the input sensing unit ISU.

The input sensing unit ISU may be provided on the thin-film encapsulation layer TFE. The input sensing unit ISU may include a first conductive layer IS-CL1, a fourth insulating layer IS-IL1, a second conductive layer IS-CL2, and a fifth insulating layer IS-IL2. Each of the first and second conductive layers IS-CL1 and IS-CL2 may have a single-layer structure or a multi-layer structure.

The conductive layer having a single-layer structure may include a metal layer or a transparent conductive layer. The metal layer may include, for example, molybdenum, silver, titanium, copper, aluminum, or an alloy thereof. The transparent conductive layer may include transparent conductive oxide such as, for example, indium tin oxide (ITO), indium zinc oxide (IZO), zinc oxide (ZnO), or indium tin zinc oxide (ITZO). In addition, the transparent conductive layer may include a conducting polymer such as, for example, PEDOT, a metal nanowire, graphene, etc.

The conductive layer having a multilayer structure may include multiple metal layers. For example, the multiple metal layers may have a three-layer structure having titanium/aluminum/titanium. The conductive layer having a multilayer structure may include at least one metal layer and at least one transparent conductive layer.

Each of the first and second conductive layers IS-CL1 and IS-CL2 may include a plurality of patterns. In an embodiment, the first conductive layer IS-CL1 may include first conductive patterns and the second conductive layer IS-CL2 may include second conductive patterns. Each of the first conductive patterns and the second conductive patterns may include sensing electrodes and signal lines described with reference to FIG. 3.

Each of the fourth and fifth insulating layers IS-IL1 and IS-IL2 may have a single- or multi-layer structure. Each of the fourth and fifth insulating layers IS-IL1 and IS-IL2 may include, for example, inorganic material, organic material, or composite material.

At least one of the fourth and fifth insulating layers IS-IL1 and IS-IL2 may include an inorganic layer. The inorganic layer may include at least one of, for example, aluminum oxide, titanium oxide, silicon oxide, silicon oxynitride, zirconium oxide, or hafnium oxide.

At least one of the fourth and fifth insulating layers IS-IL1 and IS-IL2 may include an organic layer. The organic layer may include at least one of, for example, acrylic resin, methacrylic resin, polyisoprene, vinyl-based resin, epoxy-based resin, urethane-based resin, cellulose-based resin, siloxane-based resin, polyimide-based resin, polyamide-based resin, or perylene-based resin.

Referring to FIGS. 3 to 5, the first sensor SP1 of the first sensing electrodes IE1-1 to IE1-5 may be formed of two mesh-shaped metal layers including a first mesh pattern SP1-1 and a second mesh pattern SP1-2. For example, the second mesh pattern SP1-2 may be located above the first mesh pattern SP1-1, and the fourth insulating layer IS-IL1 may be interposed between the second mesh pattern SP1-2 and the first mesh pattern SP1-1. A connecting contact hole CNT-D may be formed in the fourth insulating layer IS-IL1, and a contactor SP1-0 may be formed in the connecting contact hole CNT-D, thus electrically coupling the first mesh pattern SP1-1 with the second mesh pattern SP1-2. The contactor SP1-0 may be formed of conductive material. In an embodiment, the contactor SP1-0 may be formed of the same material as the first mesh pattern SP1-1 or the second mesh pattern SP1-2 for the convenience of process. In an embodiment, the contactor SP1-0 may be formed of material having higher electrical conductivity than that of the first mesh pattern SP1-1 or the second mesh pattern SP1-2.

The fifth insulating layer IS-IL2 may be formed on the second mesh pattern SP1-2. The fifth insulating layer IS-IL2 may entirely cover the second mesh pattern SP1-2, and may function as a planarization layer.

Similar to the first sensor SP1 of the first sensing electrodes IE1-1 to IE1-5, the second sensor SP2 of the second sensing electrodes IE2-1 to IE2-4 may be formed of a mesh pattern having two layers. The mesh patterns of two layers may be disposed with the fourth insulating layer IS-IL1 interposed therebetween, and may be electrically coupled by the contactor through the connecting contact hole CNT-D formed in the fourth insulating layer IS-IL1.

The present disclosure is not limited thereto. In an embodiment, the sensing electrode may have the mesh pattern of one layer.

Figure 6A:
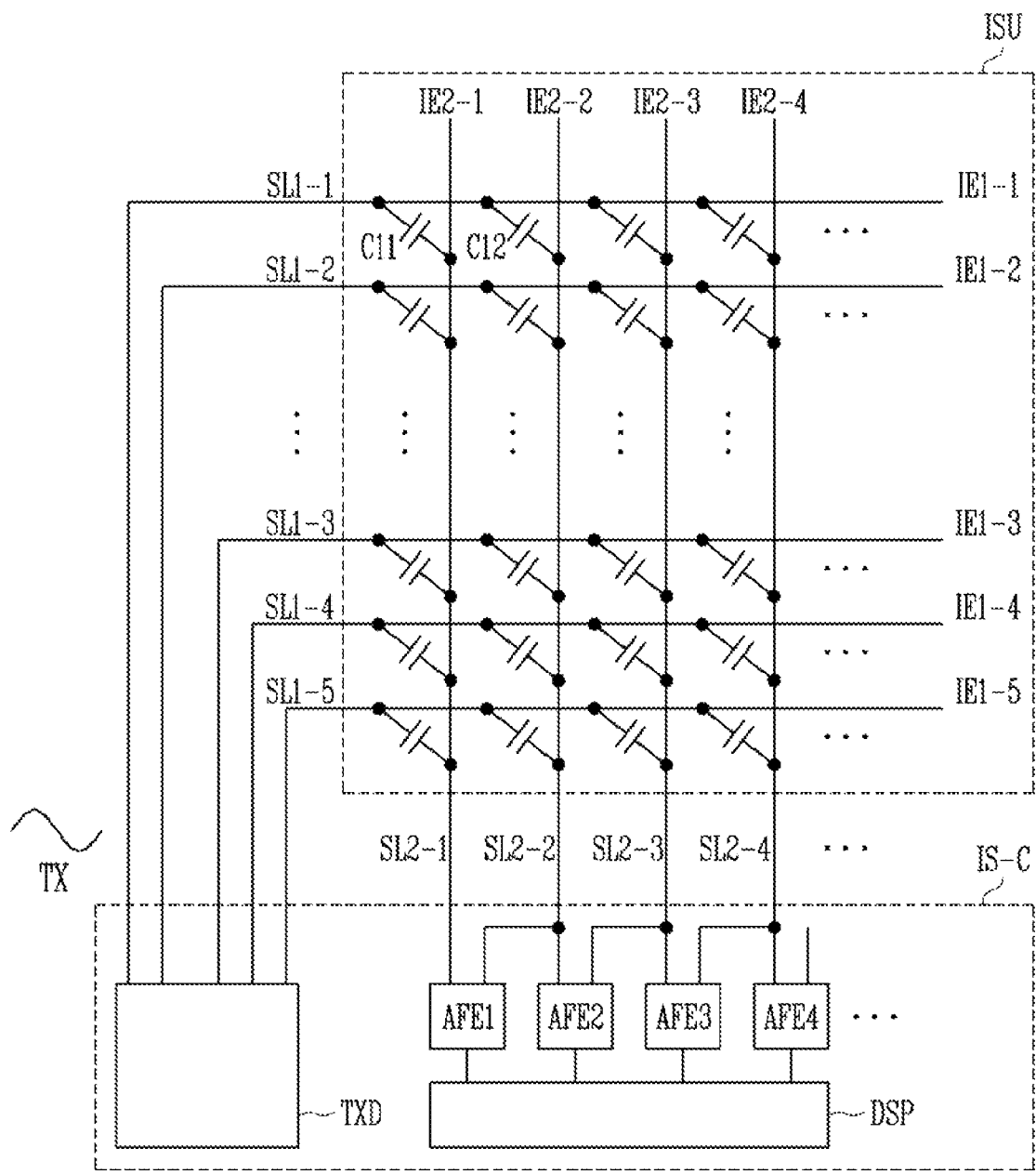
FIGS. 6A and 6B are circuit diagrams illustrating an example of an input sensing unit and an input sensing circuit included in the display device of FIG. 1, in accordance with embodiments of the present disclosure.
Figure 6B:
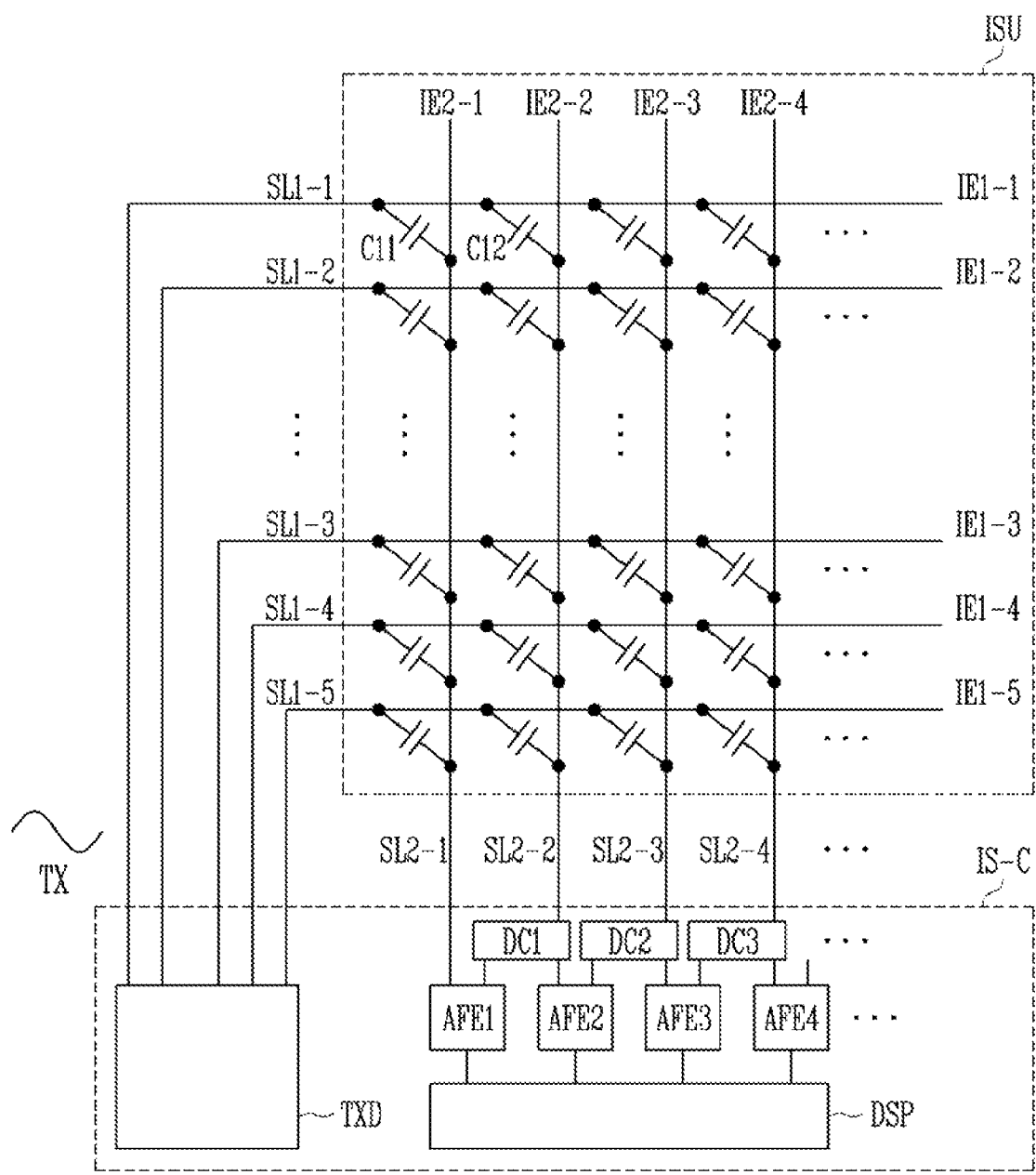

FIGS. 6A and 6B are circuit diagrams illustrating an example of an input sensing unit and an input sensing circuit included in the display device of FIG. 1, according to embodiments of the present disclosure. The input sensing unit and the input sensing circuit may constitute one input sensing device.

Referring to FIGS. 3, 6A, and 6B, since the first sensing electrodes IE1-1 to IE1-5, the second sensing electrodes IE2-1 to IE2-4, the first signal lines SL1-1 to SL1-5, and the second signal lines SL2-1 to SL2-4 have been described with reference to FIG. 3, a duplicated description thereof will not be repeated.

The input sensing circuit IS-C may include a driving signal generator TXD, analog front-ends AFE1 to AFE4, and a signal processor DSP.

The driving signal generator TXD may generate a driving signal TX (or a touch driving signal), and provide the driving signal TX to the first sensing electrodes IE1-1 to IE1-5. The driving signal generator TXD may be implemented as an oscillator. The driving signal TX may have an AC voltage of a sine wave or a square wave.

In some embodiments, the driving signal TX may include a sine wave or a cosine wave. The level change of the sine wave with time occurs in the form of a sine curve or a cosine curve, and shows more gently than the level change of the square wave. When the driving signal TX has the square wave, it may be easy to increase the frequency of the driving signal TX because the level change is fast. However, since sensing signals depending on the driving signal TX have a different waveform from the driving signal TX due to a resistance-capacitance RC delay, it may not be easy to remove noise from the sensing signal. For example, the sensing signal is compared with the corresponding driving signal, and a part where the level change of the sensing signal is different from the level change of the driving signal is extracted and removed as noise. When the driving signal is the square wave, a tangent slope of the sensing signal level may be gently changed below a specific value or may be distorted due to the resistance-capacitance delay (e.g., the charging/discharging of capacitance) (e.g., the waveform of the sensing signal is different from the waveform of the driving signal). Even by the noise, the level change of the sensing signal may occur differently from the level change of the driving signal. It may not be easy to distinguish whether the level change of the sensing signal is caused only by the resistance-capacitance delay or by the resistance-capacitance and noise. When the driving signal TX includes the sine wave, sensing signals depending on the driving signals have the same or similar sine wave as the driving signals even if the resistance-capacitance delay occurs. Thus, it may be easy to remove noise from the sensing signals. Even if the resistance-capacitance delay occurs, the level change of the driving signal of the sine wave is gentle, so that only the phase of the sensing signal may be different from the phase of the driving signal, and the waveform of the sensing signal may be substantially the same as the waveform of the driving signal. Therefore, it may be determined that a part where the level change of the sensing signal is different from the level change of the driving signal is caused by the noise without considering the resistance-capacitance delay. Thus, the noise may be easily removed.

In an embodiment, the driving signal TX provided to the first sensing electrodes IE1-1 to IE1-5 may have the same waveform and phase, and may be simultaneously provided to the first sensing electrodes IE1-1 to IE1-5. In other words, the driving signal TX (or parallel driving signal) may be provided to the first sensing electrodes IE1-1 to IE1-5 in a parallel driving manner. However, the present disclosure is not limited thereto. For example, in some embodiments, the driving signal TX may be sequentially provided to the first sensing electrodes IE1-1 to IE1-5.

In an embodiment, at least some of the driving signals provided to the first sensing electrodes IE1-1 to IE1-5 may have different waveforms (e.g., different frequencies or periods). The driving signals may be simultaneously or sequentially provided to the first sensing electrodes IE1-1 to IE1-5.

For example, since a 1-st first sensing electrode IE1-1 (or the first driving electrode) is spaced apart from the input sensing circuit IS-C compared to a 5-th first sensing electrode IE1-5 (or the fifth driving electrode), the resistance-capacitance delay of the first driving signal (and the first sensing signal corresponding thereto) provided to the 1-st first sensing electrode IE1-1 may be larger than the resistance-capacitance delay of the second driving signal (and the second sensing signal corresponding thereto) provided to the 5-th first sensing electrode IE1-5. When the first driving signal of a high frequency is applied to the 1-st first sensing electrode IE1-1, the sensing signal may not follow the driving signal due to the relatively large resistance-capacitance delay, and the sensitivity of the sensing signal may be reduced. Thus, the first driving signal provided to the 1-st first sensing electrode IE1-1 may have a relatively low frequency. The second driving signal provided to the 5-th first sensing electrode IE1-5 may also have a low frequency. In this case, since the sensing time may be increased, it may not be suitable for driving a large-area input sensing unit ISU. Thus, the second driving signal provided to the 5-th first sensing electrode IE1-5 may have a relatively high frequency so as to reduce the sensing time.

In an embodiment, the driving signal generator TXD may generate the driving signal TX synchronized with the vertical synchronization signal (e.g., the vertical synchronization signal provided from the application processor as described with reference to FIG. 2). For example, in an embodiment, the driving signal generator TXD may generate the driving signal TX while avoiding the pulse of the vertical synchronization signal, does not provide the driving signal TX (or interrupt the supply of the driving signal TX) to the first sensing electrodes IE1-1 to IE1-5 in a period where the vertical synchronization signal has a pulse, or may provide the driving signal TX of a predetermined voltage (e.g., reference voltage). Here, the reference voltage may be 0 V, a positive voltage level, or a negative voltage level, and the voltage level of the reference voltage is not particularly limited. The driving signal TX may be changed in a period between pulses of the vertical synchronization signal, and may have, for example, an AC voltage. The driving signal TX may be asynchronous with the horizontal synchronization signal.

For reference, the period of the horizontal synchronization signal (e.g., as described with reference to FIG. 2, the horizontal synchronization signal provided from the application processor) is relatively short, so that noise (e.g., relatively high-frequency noise) caused by the horizontal synchronization signal may be effectively filtered through the analog front-ends AFE1 to AFE4. However, since the period of the vertical synchronization signal is relatively long, noise caused by the vertical synchronization signal (e.g., noise of a relatively low frequency) may not be filtered through the analog front-ends AFE1 to AFE4. Therefore, the driving signal generator TXD may generate the driving signal TX synchronized with the vertical synchronization signal, e.g., avoiding the pulse of the vertical synchronization signal, thus increasing sensing sensitivity.

Sensing capacitors may be formed between the first sensing electrodes IE1-1 to IE1-5 and the second sensing electrodes IE2-1 to IE2-4. For example, a 1-1-th sensing capacitor C11 may be formed between the 1-st first sensing electrode IE1-1 (or first driving electrode) and the 1-st second sensing electrode IE2-1 (or first sensing electrode).

When the driving signal TX is applied to the 1-st first sensing electrode IE1-1, the sensing signal corresponding to the capacitance of the 1-1-th sensing capacitor C11 may be output through the 1-st second sensing electrode IE2-1.

Each of the analog front-ends AFE1 to AFE4 may be coupled to two adjacent second sensing electrodes (or second signal lines) among the second sensing electrodes IE2-1 to IE2-4, and may output a sensing value (or a differential output value) corresponding to a capacitance difference of the sensing capacitors. For example, the first analog front-end AFE1 may be coupled to the 1-st second sensing electrode IE2-1 (or first sensing electrode) and the 2-nd second sensing electrode IE2-2 (or second sensing electrode), and may output a first sensing value corresponding to a difference between the capacitance of the sensing capacitor formed on the 1-st second sensing electrode IE2-1 (e.g. the capacitance of the 1-1-th sensing capacitor C11) and the capacitance of the sensing capacitor formed on the 2-nd second sensing electrode IE2-2 (e.g. the capacitance of the 1-2-th sensing capacitor C12). Similarly, the second analog front-end AFE2 may be coupled to the 2-nd second sensing electrode IE2-2 (or second sensing electrode) and a 3-rd second sensing electrode IE2-3 (or third sensing electrode), and may output a second sensing value corresponding to a difference between the capacitance of the sensing capacitor formed on the 2-nd second sensing electrode IE2-2 and the capacitance of the sensing capacitor formed on the 3-rd second sensing electrode IE2-3. Hereinafter, the capacitances of the sensing capacitors formed between the first sensing electrodes IE1-1 to IE1-5 and the second sensing electrodes IE2-1 to IE2-4 are referred to as the sensing capacitances of the second sensing electrodes IE2-1 to IE2-4, based on the second sensing electrodes IE2-1 to IE2-4.

When a touch event occurs in a specific area of the input sensing unit ISU, a capacitance between the first sensing electrode and the second sensing electrode positioned in the corresponding area may be changed. For example, when a touch event occurs in an area where the 1-st first sensing electrode IE1-1 and the 1-st second sensing electrode IE2-1 intersect, the capacitance of the 1-1-th sensing capacitor C11 between the 1-st first sensing electrode IE1-1 and the 1-st second sensing electrode IE2-1 may be changed in an embodiment. Meanwhile, the capacitance of the 1-2-th sensing capacitor C12 between the 1-st first sensing electrode IE1-1 and the 2-nd second sensing electrode IE2-2 is not changed in an embodiment. Therefore, the first sensing value outputted through the first analog front-end AFE1 may be changed, and a location where a touch occurs may be detected based on the changed first sensing value.

Each of the analog front-ends AFE1 to AFE4 may be configured to include, for example, an amplifier, a filter, an analog-to-digital converter, etc. A detailed configuration of each of the analog front-ends AFE1 to AFE4 will be described later with reference to FIGS. 8A, 8B, 8C, and 11.

In embodiments, each of the analog front-ends AFE1 to AFE4 may be implemented as a fully differential analog front-end. For example, when the first analog front-end AFE1 includes a charge amplifier, a chopping circuit, filters, and an analog-to-digital converter which are sequentially coupled, the first analog front-end AFE1 may differentially amplify a first reception signal corresponding to the sensing capacitance of the 1-st second sensing electrode IE2-1 (or first sensing electrode) and a second reception signal corresponding to the sensing capacitance of the 2-nd second sensing electrode IE2-2 (or second sensing electrode) using the charge amplifier to output two differential signals, may demodulate and filter each of the two differential signals using the chopping circuit and the filters, and may provide the two filtered differential signals to the analog-to-digital converter. In this case, the analog-to-digital converter may output a first sensing value based on a difference between the two filtered differential signals. In other words, the fully differential analog front-end may be an analog front-end which converts the analog reception signals provided from the sensing electrodes into a plurality of differential signals up to the front end of the analog-to-digital converter (e.g., until the analog signal is converted into a digital signal), maintains and output the differential signals. For reference, the charge amplifier and the filters are configured to include amplifiers, voltage ranges of the charge amplifier and the filters are limited in a low voltage system, and the general analog front-end may not fully utilize the dynamic range of the analog-to-digital converter Thus, the fully differential analog front-end may provide two differential signals to the analog-to-digital converter to double the dynamic range of the analog-to-digital converter or the application range of the dynamic range, thus increasing the sensing sensitivity.

The sensing values outputted from the analog front-ends AFE1 to AFE4 may be provided to the signal processor DSP. The signal processor DSP may determine whether a touch has occurred or may calculate a location where the touch occurs based on the sensing values. For example, the signal processor DSP may sense an external input (e.g., sense the presence and location of an external input such as, e.g., a touch input) based on the differential output value output by the analog front-ends AFE1 to AFE4. The signal processor DSP may be implemented in hardware including logic elements, or may be implemented in software in an integrated circuit (e.g., FPGA).

In an embodiment, the input sensing circuit IS-C may further include distribution circuits DC1, DC2, and DC3.

For example, as shown in FIG. 6B, the distribution circuits DC1, DC2, and DC3 may be disposed between at least some of the second sensing electrodes IE2-1 to IE2-4 and the analog front-ends AFE1 to AFE4, may generate a plurality of signals having the same magnitude (e.g., the same voltage level, the same amount of current) based on each of the sensing signals provided from at least some of the second sensing electrodes IE2-1 to IE2-4, and may distribute the generated signals to the analog front-ends AFE1 to AFE4. For example, the distribution circuits DC1, DC2, and DC3 may include an amplifier, a buffer, etc., and may amplify or mirror each of the sensing signals to output the sensing signal.

For example, the first distribution circuit DC1 may receive a second sensing signal provided from the 2-nd second sensing electrode IE2-2, and may provide signals, which have the same magnitude or have the same magnitude as the second sensing signal, to the first analog front-end AFE1 and the second analog front-end AFE2, respectively. For reference, when the second sensing signal does not pass through the first distribution circuit DC1, the second sensing signal may be simultaneously supplied to the first analog front-end AFE1 and the second analog front-end AFE2, and the magnitude (or the maximum magnitude, e.g., the voltage level, the amount of current) of the second sensing signal may be different from the first sensing signal (e.g., the sensing signal provided from the 1-st second sensing electrode IE2-1) due to the relative increase of a load for the second sensing signal. Thus, the input sensing unit ISU may use the first distribution circuit DC1 to provide signals having the same magnitude or having the same magnitude as the second sensing signal to the first analog front-end AFE1 and the second analog front-end AFE2, respectively.

Similarly, the second distribution circuit DC2 may receive a third sensing signal provided from the 3-rd second sensing electrode IE2-3, and may provide signals, which have the same magnitude or have the same magnitude as the third sensing signal, to the second analog front-end AFE2 and the third analog front-end AFE3, respectively. The third distribution circuit DC3 may receive a fourth sensing signal provided from a 4-th second sensing electrode IE2-4, and may provide signals, which have the same magnitude or have the same magnitude as the fourth sensing signal, to the third analog front-end AFE3 and the fourth analog front-end AFE4, respectively.

As described above with reference to FIGS. 6A and 6B, the input sensing circuit IS-C may use the fully differential analog front-end to differentially amplify adjacent sensing signals and remove noise (e.g., noise caused by the horizontal synchronization signal). Thus, the driving signal may be set irrespective of the horizontal synchronization signal, and a decrease in bandwidth of the driving signal and a decrease in sensing sensitivity may be prevented.

Figure 7A:
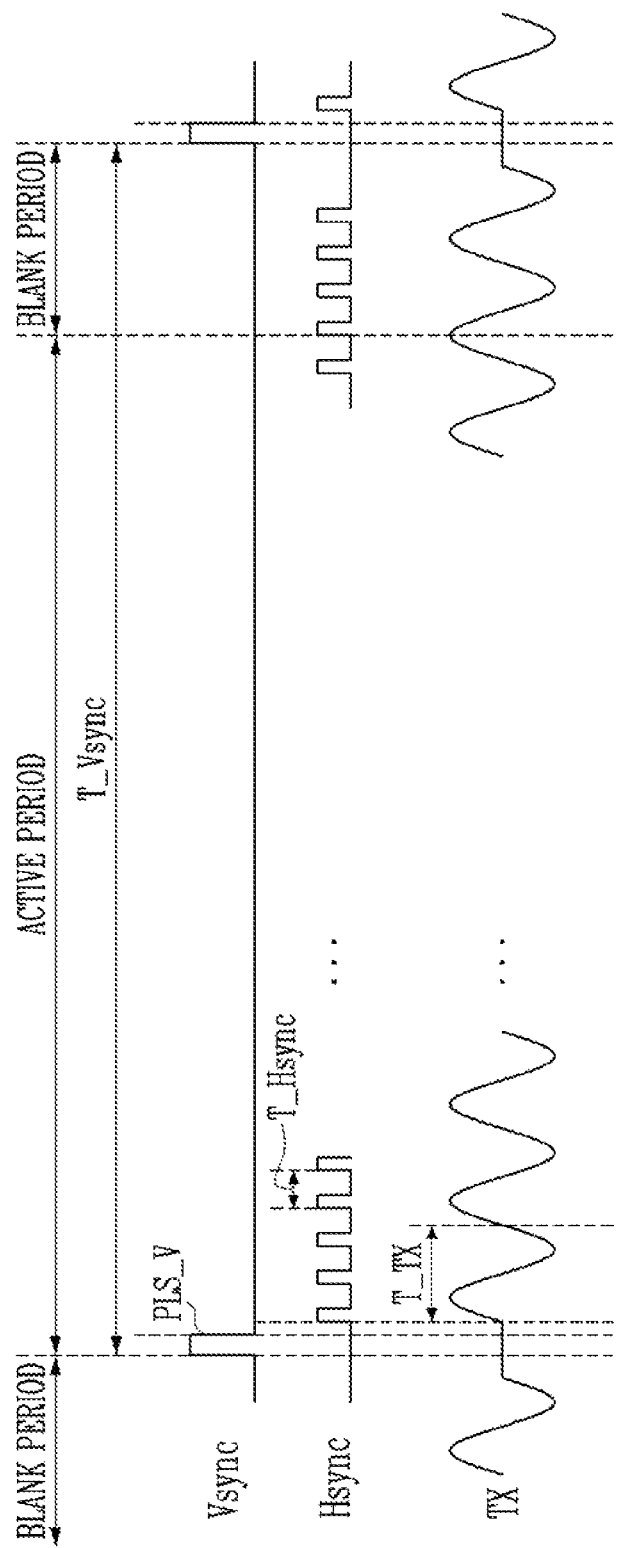
Figure 7B:
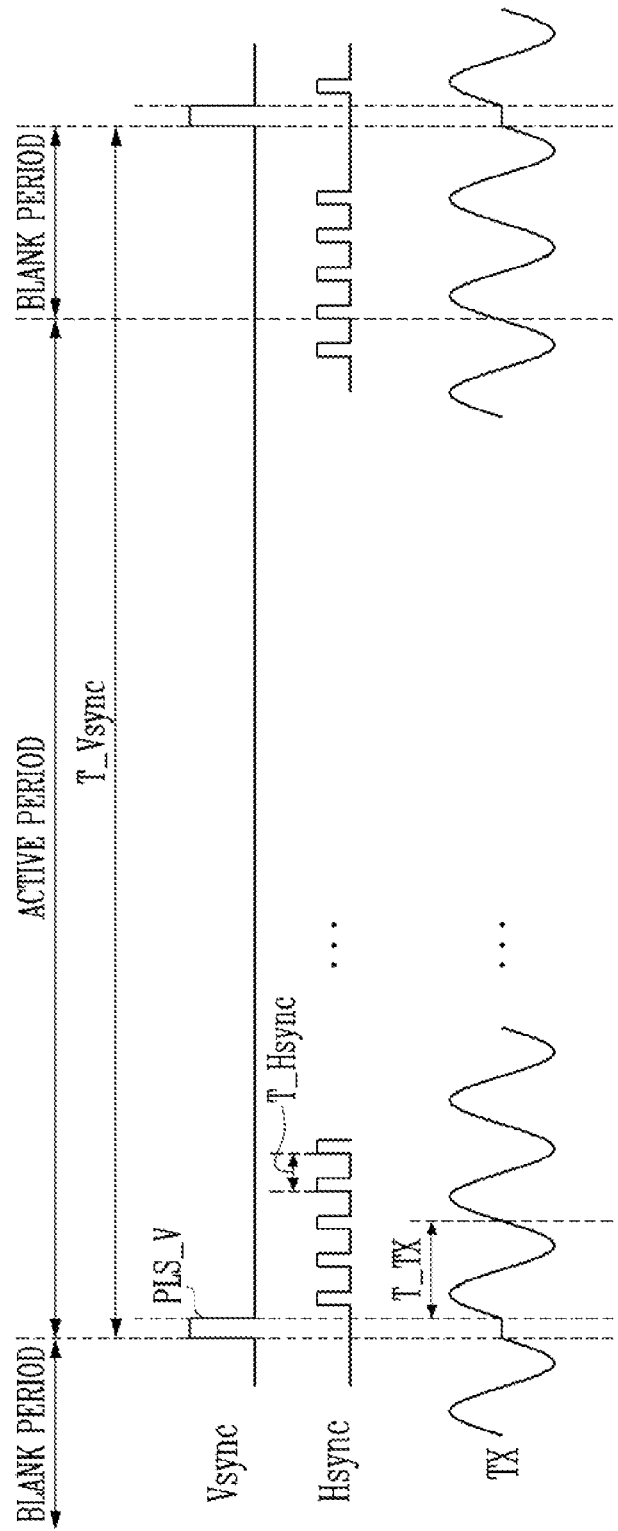

FIGS. 7A, 7B, and 7C are waveform diagrams for explaining an operation of a driving signal generator included in the input sensing circuit of FIG. 6, in accordance with embodiments of the present disclosure.

Referring to FIGS. 1, 2, 6A, 6B, 7A, 7B, and 7C, a vertical synchronization signal Vsync may be provided from an external device (e.g., a host system such as an application processor) to the input sensing circuit IS-C (see FIG. 2) and the timing control circuit TC, and may define the start of one frame. One frame may include an active period (or display period) and a blank period. In the active period, data signals may be provided to the display panel DP (see FIG. 2), and the data signals may be sequentially written to the pixels PX (see FIG. 2). The pixels PX may emit light and display an image in response to the data signals. The blank period is a period from the end of the active period in one frame to the start of the next frame (or the next active period). In an embodiment, in the blank period, the data signals are not provided to the display panel DP.

In an embodiment, the horizontal synchronization signal Hsync may be provided from the external device (e.g., a host system such as an application processor) to the timing control circuit TC, but is not provided to the input sensing circuit IS-C. The horizontal synchronization signal Hsync may define a period in which each of the images of the horizontal line included in the image of one frame is output.

For example, when the display panel DP is driven with a regeneration ratio of about 60 Hz (or when the display panel DP displays 60 frame images of one second), the period T_Vsync of the vertical synchronization signal Vsync may be about 16.67 ms (e.g., about 1/60 sec). For example, when the display panel DP includes 2280 lines (or 3040 lines), the period T_Hsync of the horizontal synchronization signal Hsync may be about 7.3 μs (or about 5.5 μs).

For example, when the display panel DP is driven with the regeneration ratio of about 120 Hz, the period T_Vsync of the vertical synchronization signal Vsync may be about 8.33 ms. The period T_Hsync of the horizontal synchronization signal Hsync may be about 3.7 μs (or about 2.7 μs).

The driving signal TX may have a sine wave (or a sine waveform) or a square wave (or a square waveform). As shown in FIG. 7A, the driving signal TX may have a sine wave.

In a period in which the pulse PLS_V of the vertical synchronization signal Vsync is generated, the driving signal TX may have a reference value (or a DC voltage). Referring to FIG. 6A, in an embodiment, the driving signal generator TXD does not output the driving signal TX or may output the driving signal TX having a specific value (e.g., about 0 V), in a period where the pulse PLS_V of the vertical synchronization signal Vsync is generated.

Immediately before a time point at which a rising edge of the vertical synchronization signal Vsync occurs (or before a time point at which the pulse PLS_V occurs), the driving signal TX may have a reference value. After a time point at which a falling edge of the vertical synchronization signal Vsync occurs (or after a time point at which the pulse PLS_V ends), the driving signal TX may be changed to a sine wave.

The driving signal TX may be asynchronous with the horizontal synchronization signal Hsync. In other words, the driving signal TX may be freely set without considering the horizontal synchronization signal Hsync (e.g., a period in which the pulse of the horizontal synchronization signal Hsync is generated). For example, in the period where the pulse of the horizontal synchronization signal Hsync is generated, the driving signal TX may be changed or have an AC value (or AC voltage). Further, even in a period where the pulse of the horizontal synchronization signal Hsync is not generated, the driving signal TX may be changed. The driving signal TX may be changed regardless of the horizontal synchronization signal Hsync. For example, the period T_TX of the driving signal TX may be about 5 s, about 4 s, or about 2.9 μs (or, the driving signal TX has the frequency of about 200 kHz, about 250 kHz, and about 350 kHz), and may be different from the period (T_Hsync) of the horizontal synchronization signal (Hsync) of about 3.7 μs (or about 2.7 μs) or a multiple thereof. The frequency of the driving signal TX may be smaller than the frequency of the horizontal synchronization signal Hsync, but the present disclosure is not limited thereto.

The driving signal TX may be changed or have a sine wave even in the blank period. Further, the driving signal may have the sine wave even in a period where the pulse of the horizontal synchronization signal Hsync in the blank period is not generated.

FIG. 7A shows that the driving signal TX has a reference value before a predetermined time from the time point when the rising edge of the vertical synchronization signal Vsync occurs, and the driving signal TX is changed into the sine wave after a predetermined time from the time point when the falling edge of the vertical synchronization signal Vsync occurs. However, the driving signal TX is not limited thereto.

As shown in FIG. 7B, the period in which the driving signal TX has the reference value may coincide with the period in which the pulse PLS_V of the vertical synchronization signal Vsync occurs. The time point when the driving signal TX starts to have a reference value may coincide with the rising edge of the vertical sync signal Vsync. The time point when the driving signal TX starts to have an AC value (or a start point of the sine wave) may coincide with the falling edge of the vertical synchronization signal Vsync.

Although FIG. 7A shows that the driving signal TX has the sine wave, the driving signal TX is not limited thereto.

As shown in FIG. 7C, a driving signal TX_1 may have a sine wave. A period T_TX_1 of the driving signal TX_1 may be substantially the same as the period T_TX of the driving signal TX of FIG. 7A, and in an embodiment, the pulse of the driving signal TX_1 is not generated in a period where the vertical synchronization signal Vsync occurs. In an embodiment, even in the period where the pulse of the vertical synchronization signal Vsync is generated, the pulse of the driving signal TX_1 may be generated.

Referring to FIGS. 7A to 7C, the driving signal TX (and the driving signal TX_1) may be synchronized with the vertical synchronization signal Vsync, may have an AC form by avoiding the pulse PLS_V of the vertical synchronization signal Vsync, and may have a reference value in a period in which the pulse PLS_V of the vertical synchronization signal Vsync is generated. Further, the driving signal TX (and the driving signal TX_1) may be asynchronous with the horizontal synchronization signal Hsync. Therefore, the period T_TX of the driving signal TX (or the period T_TX_1) may be more freely set regardless of the horizontal synchronization signal Hsync. For example, when the period T_TX of the driving signal TX is set to be relatively large, a touch sensing time corresponding to the period T_TX of the driving signal TX may be sufficiently secured and sensing sensitivity may be increased.

Figure 8A:
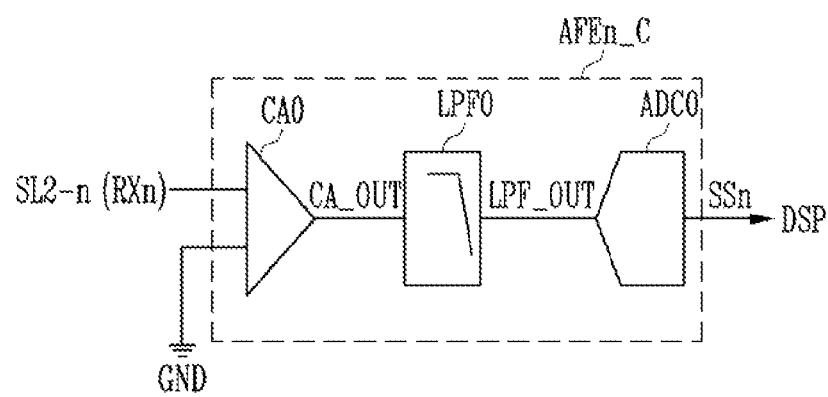
FIG. 8A is a block diagram illustrating a comparative example of an analog front-end included in the input sensing circuit of FIG. 6A.
Figure 8B:
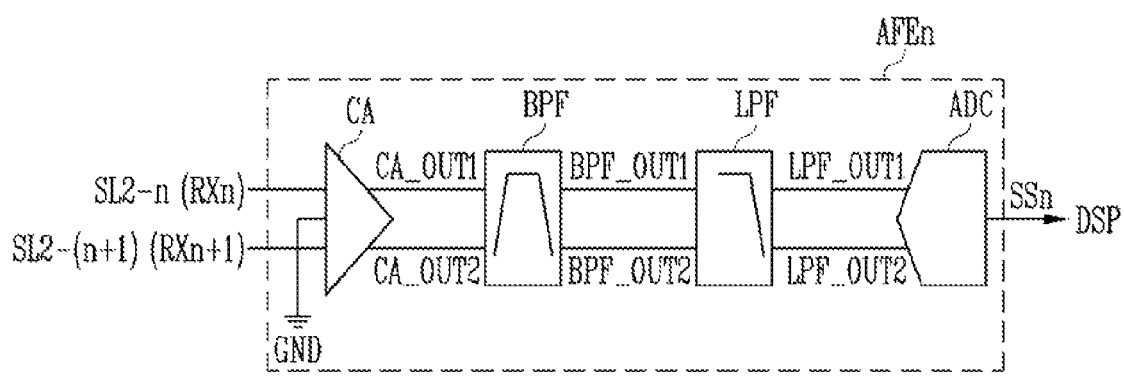
FIGS. 8B and 8C are block diagrams illustrating an example of the analog front-end included in the input sensing circuit of FIG. 6A, in accordance with embodiments of the present disclosure.
Figure 8C:
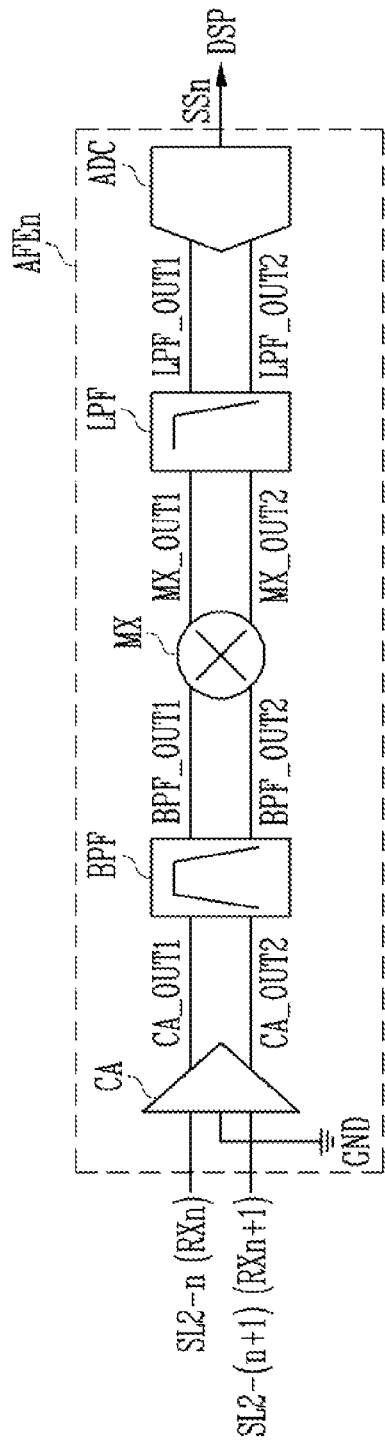

FIG. 8A is a block diagram illustrating a comparative example of the analog front-end included in the input sensing circuit of FIG. 6A. FIGS. 8B and 8C are block diagrams illustrating an example of the analog front-end included in the input sensing circuit of FIG. 6A, in accordance with embodiments of the present disclosure. Since the analog front-ends AFE1 to AFE4 shown in FIG. 6A are substantially the same as each other, an analog front-end AFEn (where n is a positive integer) including the analog front-ends AFE1 to AFE4 will be described. For example, each of the analog front-ends AFE1 to AFE4 may be implemented with the analog front-end AFEn described herein.

First, referring to FIGS. 6A and 8A, an analog front-end AFEn_C according to a comparative example may include a charge amplifier CA0, a low pass filter LPF0, and an analog-to-digital converter ADC0.

The charge amplifier CA0 may receive an n-th sensing signal RXn and a reference voltage GND (or reference signal, e.g., ground voltage) provided through an n-th second signal line SL2-n (or an n-th sensing line), and may amplify the n-th sensing signal RXn based on the reference voltage GND to output an amplified signal CA_OUT. In other words, the charge amplifier CA0 may receive and amplify only one sensing signal from one second signal line, instead of receiving two sensing signals from the two second signal lines. When the n-th sensing signal RXn includes noise (or signal attenuation or delay due to parasitic capacitance), the noise may also be amplified.

The low pass filter LPF0 may filter noise distributed in a high-frequency band of the amplified signal CA_OUT to output an output signal LPF_OUT (or filtered signal). However, noise in the low frequency band may not be filtered.

The analog-to-digital converter ADC0 may receive the output signal LPF_OUT, convert the analog output signal LPF_OUT into a digital sensing value SSn, and provide the sensing value SSn to the signal processor DSP. The sensing value SSn may correspond to the sensing capacitance of the n-th second sensing electrode coupled to the n-th second signal line SL2-n (or the n-th sensing line).

When the display device DD (see FIG. 1), and the input sensing unit ISU, becomes thinner and larger, the parasitic capacitance for the second sensing electrode (e.g., the capacitance of the parasitic capacitor formed by overlapping the second sensing electrode with other elements, in addition to the sensing capacitor formed between the first sensing electrode and the second sensing electrode) may be increased, and a ratio of the sensing capacitance (or a change in the sensing capacitance) of the second sensing electrode to the parasitic capacitance may be reduced. That is, a signal-to-noise ratio may be reduced, and sensing sensitivity may be deteriorated.

Therefore, the analog front-end AFEn according to embodiments of the present disclosure described with reference to FIGS. 8B and 8C may be implemented as a fully differential circuit to more effectively remove noise included in the sensing signal, increase the dynamic range (or the application range of the dynamic range) of the analog-to-digital converter, and increase the sensing sensitivity.

Referring to FIGS. 8B and 8C, the analog front-end AFEn may include a charge amplifier CA, a band pass filter BPF, a low pass filter LPF, and an analog-to-digital converter ADC. The analog front-end AFEn may further include a mixer MX.

The charge amplifier CA may receive an n-th sensing signal RXn provided through an n-th second signal line SL2-n (or n-th sensing line) and an n+1-th sensing signal RXn+1 provided through an n+1-th second signal line SL2-(n+1) (or n+1-th sensing line), and may differentially amplify the n-th sensing signal Rxn and the n+1-th sensing signal RXn+1 to output a first differential signal CA_OUT1 (or first amplification signal) and a second differential signal CA_OUT2 (or second amplification signal), which are complementary.

In embodiments, the charge amplifier CA may be implemented as a fully differential amplifier. A typical differential amplifier may be defined as a differential amplifier that outputs one signal by differentiating two input signals, and a fully differential amplifier may be defined as a differential amplifier that outputs two differential signals (e.g., complementary signals) by differentiating two input signals. In embodiments, the charge amplifier CA implemented as the fully differential amplifier may increase or maximize the magnitude of the sensing signals in relation to the analog-to-digital converter ADC (e.g., a differential analog-to-digital converter that differentiates two analog signals to output a digital value).

A reference voltage GND may be provided to the charge amplifier CA. The reference voltage GND may be used as the driving voltage of the charge amplifier CA. A detailed configuration of the charge amplifier CA will be described below with reference to FIGS. 9A to 9C.

The band pass filter BPF may select only signals of a specific frequency band of each of the first differential signal CA_OUT1 and the second differential signal CA_OUT2 to output a first filtered signal BPF_OUT1 and a second filtered signal BPF_OUT2. The operation of the band pass filter BPF will be described later with reference to FIG. 9D along with the operations of the low pass filter LPF and the mixer MX.

The band pass filter BPF may selectively amplify the first differential signal CA_OUT1 to output the first filtered signal BPF_OUT1, and selectively amplify the second differential signal CA_OUT2 to output the second filtered signal BPF_OUT2. For example, the band pass filter BPF may selectively amplify the first differential signal CA_OUT1 applied to a negative input terminal of the fully differential amplifier to output the first filtered signal BPF_OUT1 through a positive output terminal of the fully differential amplifier, and may selectively amplify the second differential signal CA_OUT2 applied to a second input terminal of the fully differential amplifier to output the second filtered signal BPF_OUT2 through a negative output terminal of the fully differential amplifier.

The second filtered signal BPF_OUT2 may have a waveform in which the first filtered signal BPF_OUT1 is inverted.

The mixer MX may change the respective frequencies of the first filtered signal BPF_OUT1 and the second filtered signal BPF_OUT2 to output a first demodulation signal MX_OUT1 and a second demodulation signal MX_OUT2. For example, the mixer MX may demodulate the first filtered signal BPF_OUT1 to output the first demodulation signal MX_OUT1, and may demodulate the second filtered signal BPF_OUT2 to output the second demodulation signal MX_OUT2.

For example, the mixer MX may be implemented as a chopping circuit (or chopper) including two input terminals and two output terminals, and may alternately couple the first filtered signal BPF_OUT1 and the second filtered signal BPF_OUT2 provided on the two input terminals to the two output terminals, thus generating the first demodulation signal MX_OUT1 and the second demodulation signal MX_OUT2. In other words, the mixer MX may extract a touch signal TS (see FIG. 9D) from the first filtered signal BPF_OUT1 and the second filtered signal BPF_OUT2. In some embodiments, the mixer MX may be omitted.

The low pass filter LPF may filter noise distributed in the high frequency band of each of the first filtered signal BPF_OUT1 and the second filtered signal BPF_OUT2 to output a first output signal LPF_OUT1 (or third filtered signal) and a second output signal LPF_OUT2 (or fourth filtered signal). When the analog front-end AFEn includes the mixer MX, the low pass filter LPF may filter noise distributed in the high frequency band of each of the first demodulation signal MX_OUT1 and the second demodulation signal MX_OUT2 to output the first output signal LPF_OUT1 (or third filtered signal) and the second output signal LPF_OUT2 (or fourth filtered signal).

For example, the low pass filter LPF may be implemented to include a differential amplifier (or fully differential amplifier), a resistor, and a capacitor, and may amplify only a signal of a relatively low frequency band. The low pass filter LPF may filter the noise of the first demodulation signal MX_OUT1 to output the first output signal LPF_OUT1, and may filter the noise of the second demodulation signal MX_OUT2 to output the second output signal LPF_OUT2. For example, the low pass filter LPF may filter the noise of the first demodulation signal MX_OUT1 applied to a negative terminal of the fully differential amplifier to output the first output signal LPF_OUT1 through the positive output terminal of the fully differential amplifier, and may filter the noise of the second demodulation signal MX_OUT2 applied to a positive terminal of the fully differential amplifier to output the second output signal LPF_OUT2 through the positive output terminal of the fully differential amplifier. The second output signal LPF_OUT2 may have a polarity different from that of the first output signal LPF_OUT1.

As described above, the band pass filter BPF, the mixer MX, and the low pass filter LPF may implement the function of a demodulator to recover or extract only the signals (e.g., the first output signal LPF_OUT1 and the second output signal LPF_OUT2) corresponding to the driving signal TX from the n-th sensing signal RXn and the n+1-th sensing signal RXn+1.

The analog-to-digital converter ADC may receive the first output signal LPF_OUT1 and the second output signal LPF_OUT2, and may provide a sensing value (or a differential output value) corresponding to a difference (e.g., ILFP_OUT1−LPF_OUT21) between the first output signal LPF_OUT1 and the second output signal LPF_OUT2 to the signal processor DSP. For example, the analog-to-digital converter ADC may convert the first output signal LPF_OUT1 into a first output value, may convert the second output signal LPF_OUT2 into a second output value, and may output a sensing value by differentiating the first output value and the second output value.

Referring to FIGS. 8B and 8C, the analog front-end AFEn may remove the noise (e.g., noise caused by the horizontal synchronization signal Hsync described with reference to FIG. 7A) from the n-th sensing signal RXn and the n+1-th sensing signal RXn+1, using the charge amplifier CA, the band pass filter BPF, the mixer MX, and the low pass filter LPF. Further, the analog front-end AFEn may be implemented as the fully differential circuit (or fully differential analog front-end) that maintains and outputs two differential signals from the charge amplifier CA to the front end (e.g., low pass filter LPF) of the analog-to-digital converter ADC. The analog front-end AFEn may provide two differential signals to the analog-to-digital converter ADC to double the dynamic range of the analog-to-digital converter or the application range of the dynamic range, thus increasing the sensing sensitivity.

Figure 9A:
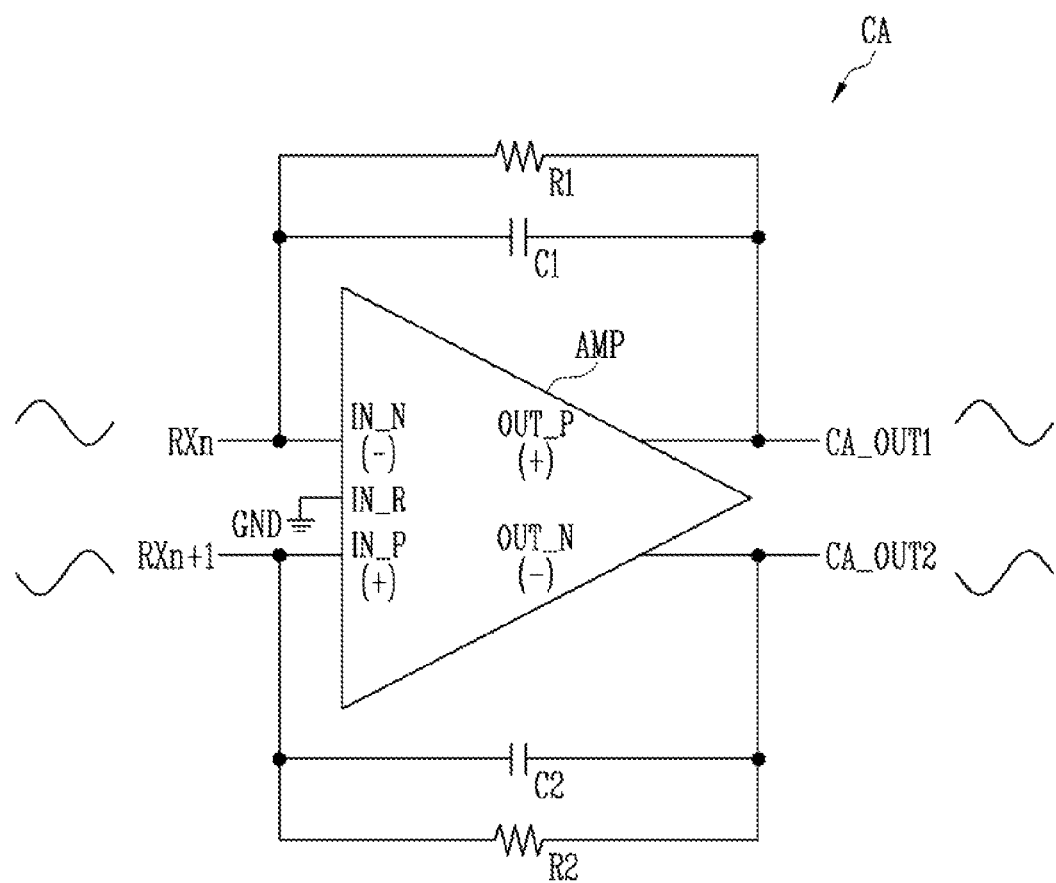
FIGS. 9A, 9B, and 9C are circuit diagrams illustrating an example of a charge amplifier included in the analog front-end of FIG. 8C, in accordance with embodiments of the present disclosure.
Figure 9B:
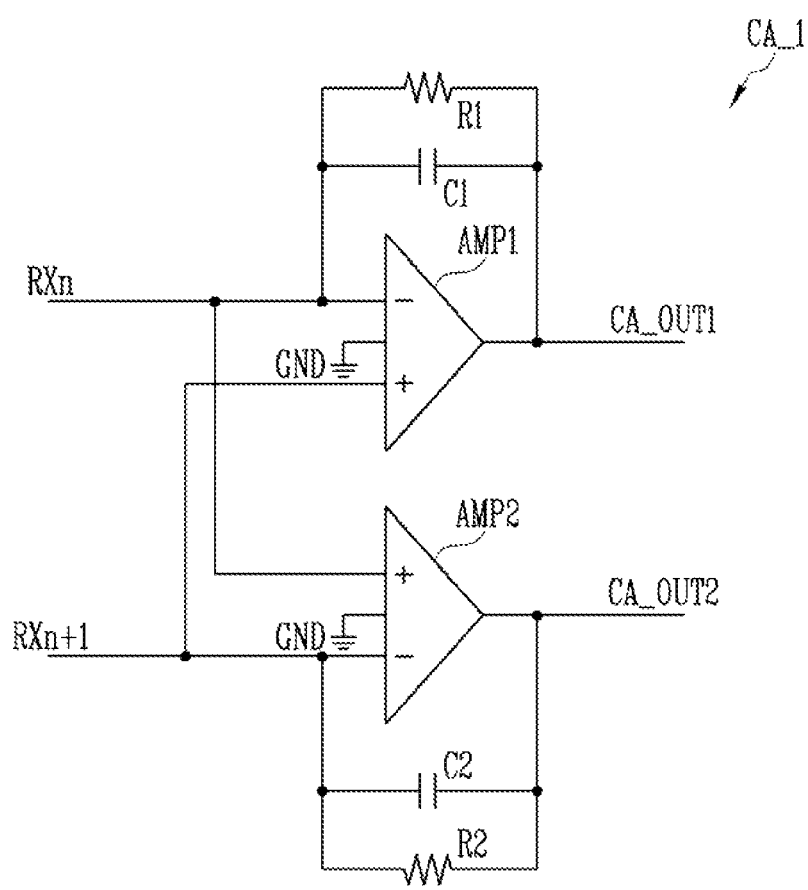
Figure 9C:
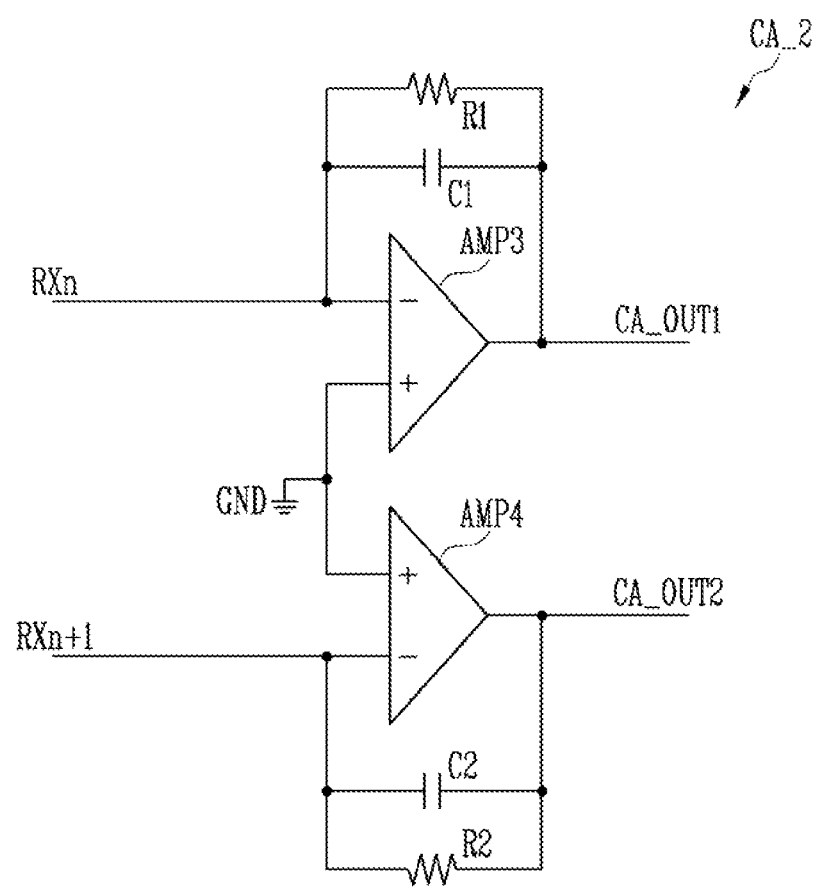

FIGS. 9A, 9B, and 9C are circuit diagrams illustrating an example of a charge amplifier included in the analog front-end of FIG. 8C, in accordance with embodiments of the present disclosure.

First, referring to FIGS. 8B, 8C, and 9A, the charge amplifier CA may include an amplifier AMP, a first capacitor C1, a first resistor R1, a second capacitor C2, and a second resistor R2.

The amplifier AMP may include a second input terminal IN_P (e.g., a positive input terminal ("+")), a first input terminal IN_N (e.g., a negative input terminal ("−")), a first output terminal OUT_P (e.g., a positive output terminal ("+")), and a second output terminal OUT_N (e.g., a negative output terminal ("−")). The amplifier AMP may further include a third input terminal IN_R (or, a reference input terminal), and the reference voltage GND may be applied to the third input terminal IN_R.

The first input terminal IN_N of the amplifier AMP may be coupled to the n-th second signal line SL2-n, and the n-th sensing signal RXn may be applied to the first input terminal IN_N of the amplifier AMP. The second input terminal IN_N of the amplifier AMP may be coupled to the n+1-th second signal line SL2-(n+1), and the n+1-th sensing signal RXn+1 may be applied to the second input terminal IN_P of the amplifier AMP.

The first capacitor C1 and the first resistor R1 may be coupled in parallel between the first input terminal IN_N and the first output terminal OUT_P of the amplifier AMP. Thus, the first differential signal CA_OUT1 corresponding to a difference between the n-th sensing signal RXn and the n+1-th sensing signal RXn+1 may be output through the first output terminal OUT_P of the amplifier AMP.

Similarly, the second capacitor C2 and the second resistor R2 may be coupled in parallel between the first input terminal IN_N and the first output terminal OUT_P of the amplifier AMP. The second resistor R2 (and the first resistor R1) may have a fixed resistance value or may be formed of a variable resistor or a switch. Thus, the second differential signal CA_OUT2 corresponding to a difference between the n+1-th sensing signal RXn+1 and the n-th sensing signal RXn may be output through the second output terminal OUT_N of the amplifier AMP. The second differential signal CA_OUT2 may have a waveform in which the first differential signal CA_OUT1 is inverted.

The charge amplifier CA may remove an AC offset and a common noise by outputting the first differential signal CA_OUT1 and the second differential signal CA_OUT2 in a differential manner.

In embodiments, the amplifier AMP may include a plurality of sub-amplifiers.

As shown in FIG. 9B, in an embodiment, the charge amplifier CA_1 may include a first sub-amplifier AMP1 (or a first amplifier) and a second sub-amplifier AMP2 (or a second amplifier). The first sub-amplifier AMP1 may include input/output terminals corresponding to the second input terminal IN_P, the first input terminal IN_N, and the first output terminal OUT_P of the amplifier AMP. The n-th sensing signal RXn may be applied to the negative input terminal "−" of the first sub-amplifier AMP1, and the n+1-th sensing signal RXn+1 may be applied to the positive input terminal "+" of the first sub-amplifier AMP1. According to the connection configuration of the first resistor R1, the first capacitor C1, and the first sub-amplifier AMP1, the first sub-amplifier AMP1 may amplify and output the charge of the n-th sensing signal RXn based on the n+1-th sensing signal RXn+1. Similarly, the second sub-amplifier AMP2 may include input/output terminals corresponding to the second input terminal IN_P, the first input terminal IN_N, and the second output terminal OUT_N of the amplifier AMP. The n-th sensing signal RXn may be applied to the positive input terminal "+" of the second sub-amplifier AMP2, and the n+1-th sensing signal RXn+1 may be applied to the negative input terminal "−" of the second sub-amplifier AMP2. According to the connection configuration of the second resistor R2, the second capacitor C2, and the second sub-amplifier AMP2, the second sub-amplifier AMP2 may amplify and output the charge of the n+1-th sensing signal RXn+1 based on the n-th sensing signal RXn.

The reference voltage GND may be provided to the first sub-amplifier AMP1 and the second sub-amplifier AMP2 as a driving voltage. However, the present disclosure is not limited thereto.

As shown in FIG. 9C, in an embodiment, the charge amplifier CA_2 may include a third sub-amplifier AMP3 and a fourth sub-amplifier AMP4. The n-th sensing signal RXn may be applied to the negative input terminal "−" of the third sub-amplifier AMP3, and the reference voltage GND may be applied to the positive input terminal "+" of the third sub-amplifier AMP3. According to the connection configuration of the first resistor R1, the first capacitor C1, and the third sub-amplifier AMP3, the third sub-amplifier AMP3 may amplify and output the charge of the n-th sensing signal RXn based on the reference voltage GND. Similarly, the reference voltage GND may be applied to the positive input terminal "+" of the fourth sub-amplifier AMP4, and the n+1-th sensing signal RXn+1 may be applied to the negative input terminal "−" of the fourth sub-amplifier AMP4. According to the connection configuration of the second resistor R2, the second capacitor C2, and the fourth sub-amplifier AMP4, the fourth sub-amplifier AMP4 may amplify and output the charge of the n+1-th sensing signal RXn+1 based on the reference voltage GND.

As described above, the charge amplifier CA may be implemented as the fully differential amplifier to output the first differential signal CA_OUT1 and the second differential signal CA_OUT2 from which the AC offset and the common noise are removed. On the other hand, the charge amplifier CA_2 may output the first differential signal CA_OUT1 and the second differential signal CA_OUT2 generated by amplifying the n-th sensing signal RXn and the n+1-th sensing signal RXn+1, respectively, based on the reference voltage GND.

Figure 9D:
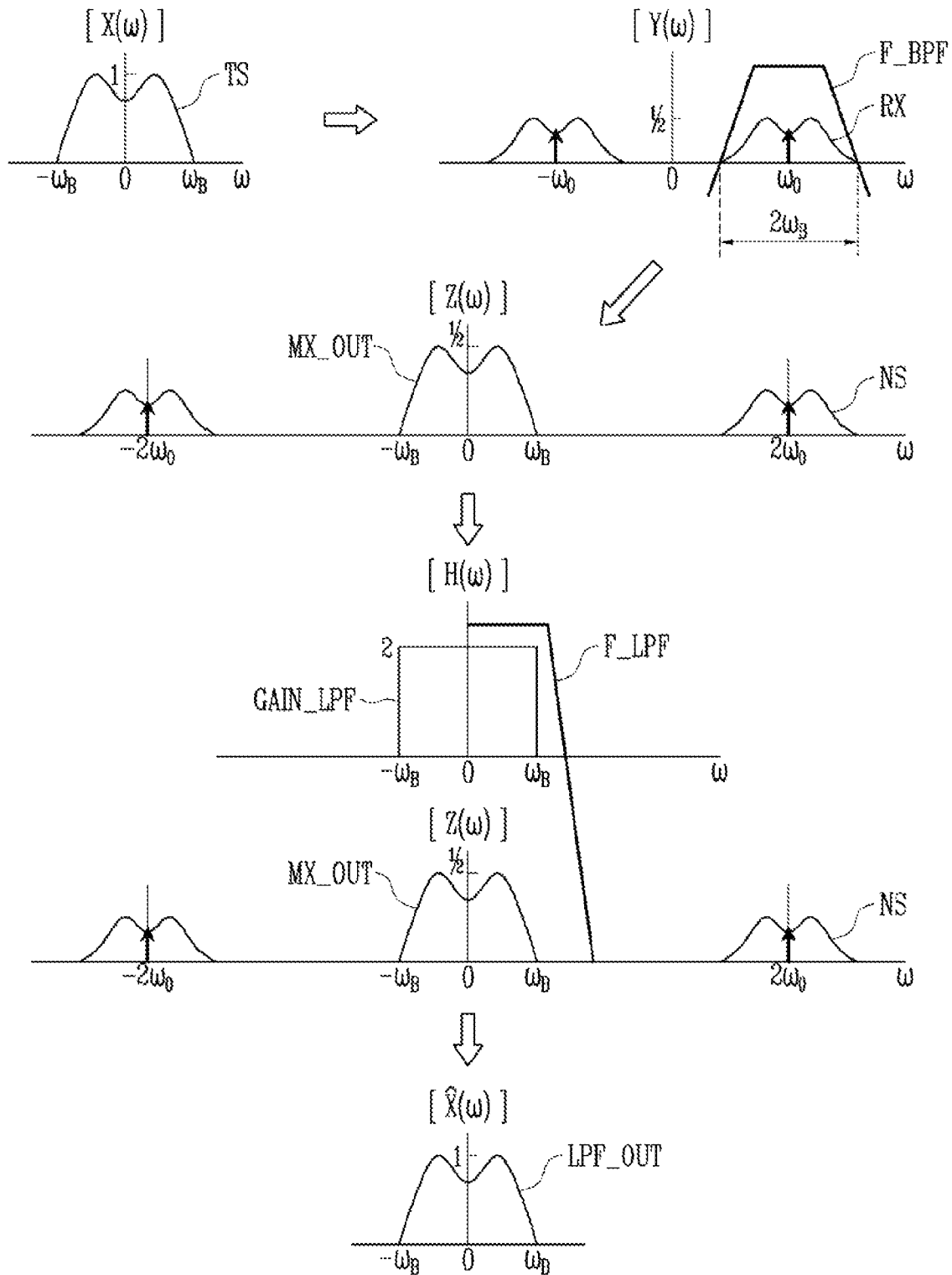
FIG. 9D is a diagram illustrating an example of signals for explaining the operation of the analog front-end of FIG. 8C, in accordance with embodiments of the present disclosure.

FIG. 9D is a diagram illustrating an example of signals for explaining the operation of the analog front-end of FIG. 8C, in accordance with embodiments of the present disclosure.

Referring to FIGS. 6A, 6B, 8B, 8C, and 9D, a touch signal TS may have a reference within a reference bandwidth (e.g., $-\omega B$ to $\omega B$) according to the driving frequency (or sensing period) of the input sensing unit IS-C (see FIG. 6A). The sensing signal RX provided from each of the second sensing electrodes IE2-1 to IE2-4 (see FIG. 6A) to the analog front-end AFEn may be modulated by the driving signal TX, and may have a frequency within the reference bandwidth $2\omega 0$ based on the frequency $\omega 0$ of the driving signal TX. The sensing signal RX includes a negative frequency component (e.g., $-\omega 0$). The negative frequency component has the same magnitude as a positive frequency component, but has a phase difference of about 180 degrees from the positive frequency component. The negative frequency component is not considered because it is impactless. The band pass filter BPF may have a first transfer function F_BPF corresponding to the frequency band of the sensing signal RX, and may amplify only a signal within the corresponding frequency band. For example, the band pass filter BPF may be configured to include a differential amplifier (or fully differential amplifier), a capacitor, and a resistor, and may amplify only a signal corresponding to the frequency band (e.g., about 200 kHz to about 350 kHz) of the driving signal TX (see FIG. 7A).

The mixer MX may convert a signal in a relatively high frequency band (e.g., a signal in the frequency band corresponding to the band pass filter BPF) into a demodulation signal MX_OUT in a low frequency band (e.g., a signal in the frequency band corresponding to the touch signal TS). Furthermore, the mixer MX may convert noise in a relatively low frequency band into high-frequency noise NS in a high frequency band. For reference, low-frequency noise (e.g., noise called "1/f noise") may be generally generated in the semiconductor elements (e.g., transistors) forming the analog front-end AFEn, and the mixer MX may move such low-frequency noise to a high-frequency band through a chopping operation.

The low pass filter LPF may have a second transfer function F_LPF corresponding to the frequency band of the touch signal TS. For example, a gain GAIN_LPF of the second transfer function F_LPF may be equal to about 2 in a frequency band of $\omega B$ or less. In this case, the low-pass filter LPF may amplify only the demodulation signal MX_OUT in the low frequency band and output it as the output signal LPF_OUT.

Figure 10:
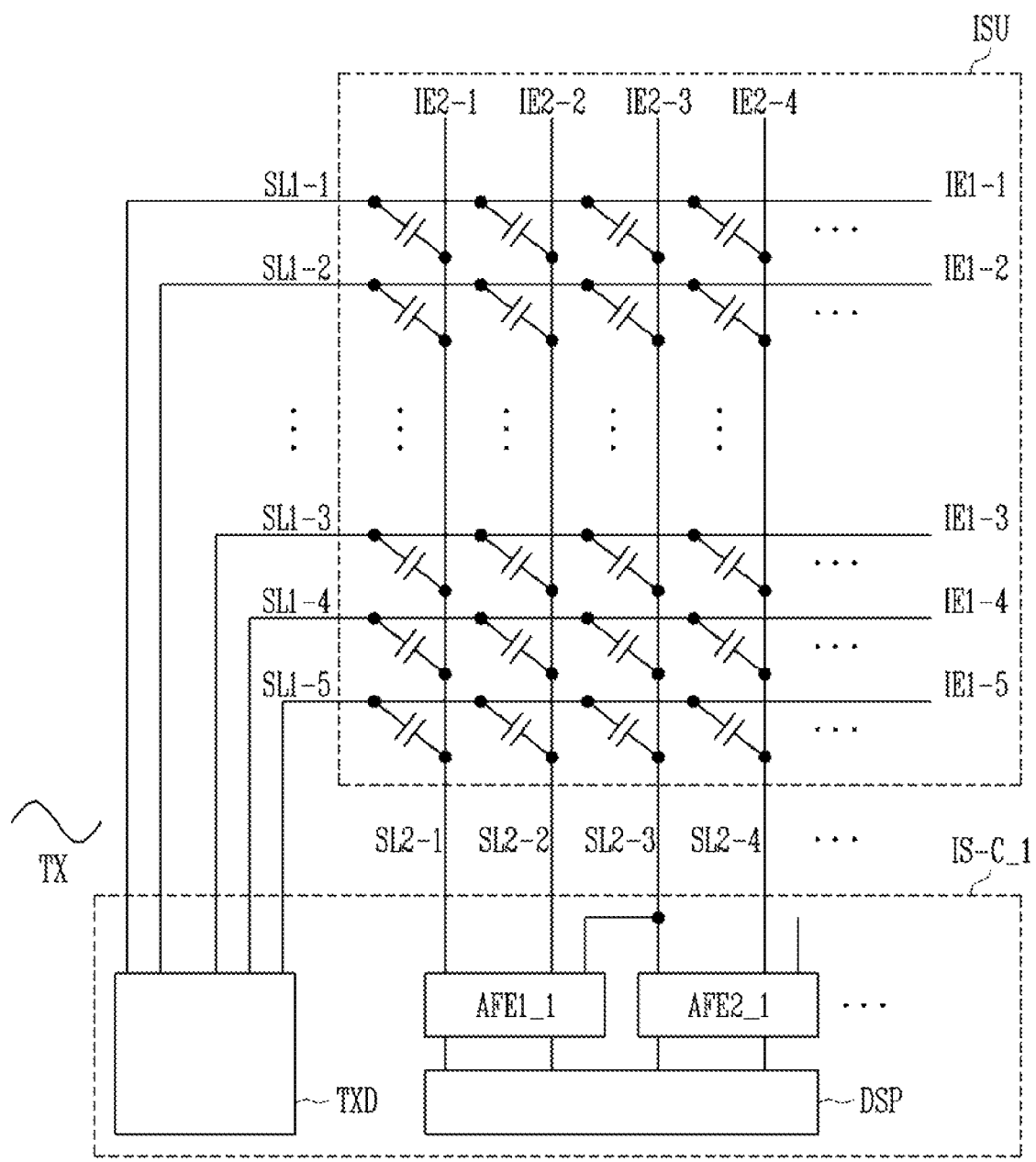
FIG. 10 is a circuit diagram illustrating an example of the input sensing unit and the input sensing circuit included in the display device of FIG. 1, in accordance with embodiments of the present disclosure.

FIG. 10 is a circuit diagram illustrating an example of the input sensing unit and the input sensing circuit included in the display device of FIG. 1, in accordance with embodiments of the present disclosure.

Referring to FIGS. 6A, 6B, and 10, an input sensing circuit IS-C_1 is different from the input sensing circuit IS-C of FIGS. 6A and 6B in that it includes analog front-ends AFE1_1 and AFE2_1. Since the input sensing circuit IS-C_1 is similar to the input sensing circuit IS-C of FIGS. 6A and 6B except for the analog front-ends AFE1_1 and AFE2_1, a duplicated description of components and technical aspects previously described will not be repeated for convenience of explanation.

Each of the analog front-ends AFE1_1 and AFE2_1 may be coupled to three adjacent second sensing electrodes (or second signal lines) among the second sensing electrodes IE2-1 to IE2-4. Among the three second sensing electrodes, two sensing electrodes may be selected.

For example, the first analog front-end AFE1_1 may be coupled to a 1-st second sensing electrode IE2-1 (or first sensing electrode), a 2-nd second sensing electrode IE2-2 (or second sensing electrode), and a 3-rd second sensing electrode IE2-3 (or third sensing electrode), may select the 1-st second sensing electrode IE2-1 and the 2-nd second sensing electrode IE2-2 in a first period, and may select the 2-nd second sensing electrode IE2-2 and the 3-rd second sensing electrode IE2-3 in a second period (e.g. a second period different from the first period). Similarly, the second analog front-end AFE2_1 may be coupled to the 3-rd second sensing electrode IE2-3 (or third sensing electrode), a 4-th second sensing electrode IE2-4 (or fourth sensing electrode), and a 5-th second sensing electrode (or fifth sensing electrode), may select the 3-rd second sensing electrode IE2-3 and the 4-th second sensing electrode IE2-4 in the first period, and may select the 4-th second sensing electrode IE2-4 and the 5-th second sensing electrode in the second period.

In embodiments, the analog front-ends AFE1_1 and AFE2_1 may be operated in one of a first mode, a second mode, and a third mode, and may output at least one sensing value.

In the first mode (or normal mode), each of the analog front-ends AFE1_1 and AFE2_1 may output a sensing value corresponding to a difference in sensing capacitances corresponding to the two selected sensing electrodes. For example, the first analog front-end AFE1_1 may output a first sensing value corresponding to a difference between the sensing capacitance formed in the 1-st second sensing electrode IE2-1 and the sensing capacitance formed in the 2-nd second sensing electrode IE2-2 in the first period, and may output a second sensing value corresponding to a difference between the sensing capacitance formed in the 2-nd second sensing electrode IE2-2 and the sensing capacitance formed in the 3-rd second sensing electrode IE2-3 in the second period (e.g. the second period different from the first period).

Similarly, the second analog front-end AFE2_1 may output a third sensing value corresponding to a difference between the sensing capacitance formed in the 3-rd second sensing electrode IE2-3 and the sensing capacitance formed in the 4-th second sensing electrode IE2-4 in the first period, and may output a fourth sensing value corresponding to a difference between the sensing capacitance formed in the 4-th second sensing electrode IE2-4 and the sensing capacitance formed in the 5-th second sensing electrode in the second period.

In other words, in the first mode, the analog front-ends AFE1_1 and AFE2_1 may output a sensing value corresponding to a difference in sensing capacitances of the second sensing electrodes selected from among the three sensing electrodes. For example, when the display panel DP (see FIG. 1) has a relatively large area or the display panel DP is driven with a relatively large regeneration ratio, e.g., when the load (e.g., parasitic capacitance, driving frequency) of the input sensing unit ISU caused by the display panel DP is large, the analog front-ends AFE1_1 and AFE2_1 (or the input sensing unit ISU) may be operated in the first mode.

In the second mode (or inspection mode), each of the analog front-ends AFE1_1 and AFE2_1 may output two sensing values corresponding to sensing capacitances corresponding to the two selected sensing electrodes, respectively. For example, the first analog front-end AFE1_1 may output a first sensing value corresponding to the sensing capacitance formed in the 1-st second sensing electrode IE2-1 and a second sensing value corresponding to the sensing capacitance formed in the 2-nd second sensing electrode IE2-2. Similarly, the second analog front-end AFE2_1 may output a third sensing value corresponding to the sensing capacitance formed in the 3-rd second sensing electrode IE2-3 and a fourth sensing value corresponding to the sensing capacitance formed in the 4-th second sensing electrode IE2-4. The sensing value in the first mode is a relative value corresponding to a difference between sensing capacitances of an adjacent pair of second sensing electrodes, and is different from the sensing capacitance of each of the second sensing electrodes, that is, an absolute value. Thus, in the second mode, each of the analog front-ends AFE1_1 and AFE2_1 may output a sensing value corresponding to each of sensing capacitances of the second sensing electrodes, that is, an absolute value. In the manufacturing process of the display device DD (or the input sensing unit ISU), the absolute value may be used to measure or inspect the characteristics (e.g., sensing capacitance and parasitic capacitance for the specific second sensing electrode) of the input sensing unit ISU. When the load of the input sensing unit ISU caused by the display panel DP is small, the analog front-ends AFE1_1 and AFE2_1 (or the input sensing unit ISU) may be operated in the second mode. The second mode will be described below with reference to FIG. 12B.

In the third mode (or amplification mode), each of the analog front-ends AFE1_1 and AFE2_1 may further amplify a difference between sensing capacitances corresponding to two selected sensing electrodes, and output the sensing value corresponding to the amplified difference. For example, each of the analog front-ends AFE1_1 and AFE2_1 may amplify sensing signals using charge amplifiers of two or more stages which are coupled in series, instead of one charge amplifier CA (see FIG. 8B). For example, in the case of non-contact input including, e.g., hovering over the display device DD without physically contacting the display device DD, or applying external input having a small touch area such as a pen rather than the direct touch of a user (e.g., a user's finger), a change in sensing capacitance caused by the external input may not be large in the display surface of the input sensing unit ISU (or the display device DD (see FIG. 1). Thus, in an environment that allows an external input such as the non-contact/hovering input or the pen input (or in a situation where higher sensing sensitivity is required), the analog front-ends AFE1_1 and AFE2_1 (or the input sensing unit ISU) may be operated in the third mode.

The distribution circuits DC1, DC2, and DC3 described with reference to FIG. 6B may be applied to the input sensing circuit IS-C_1 of FIG. 10.

Figure 11:
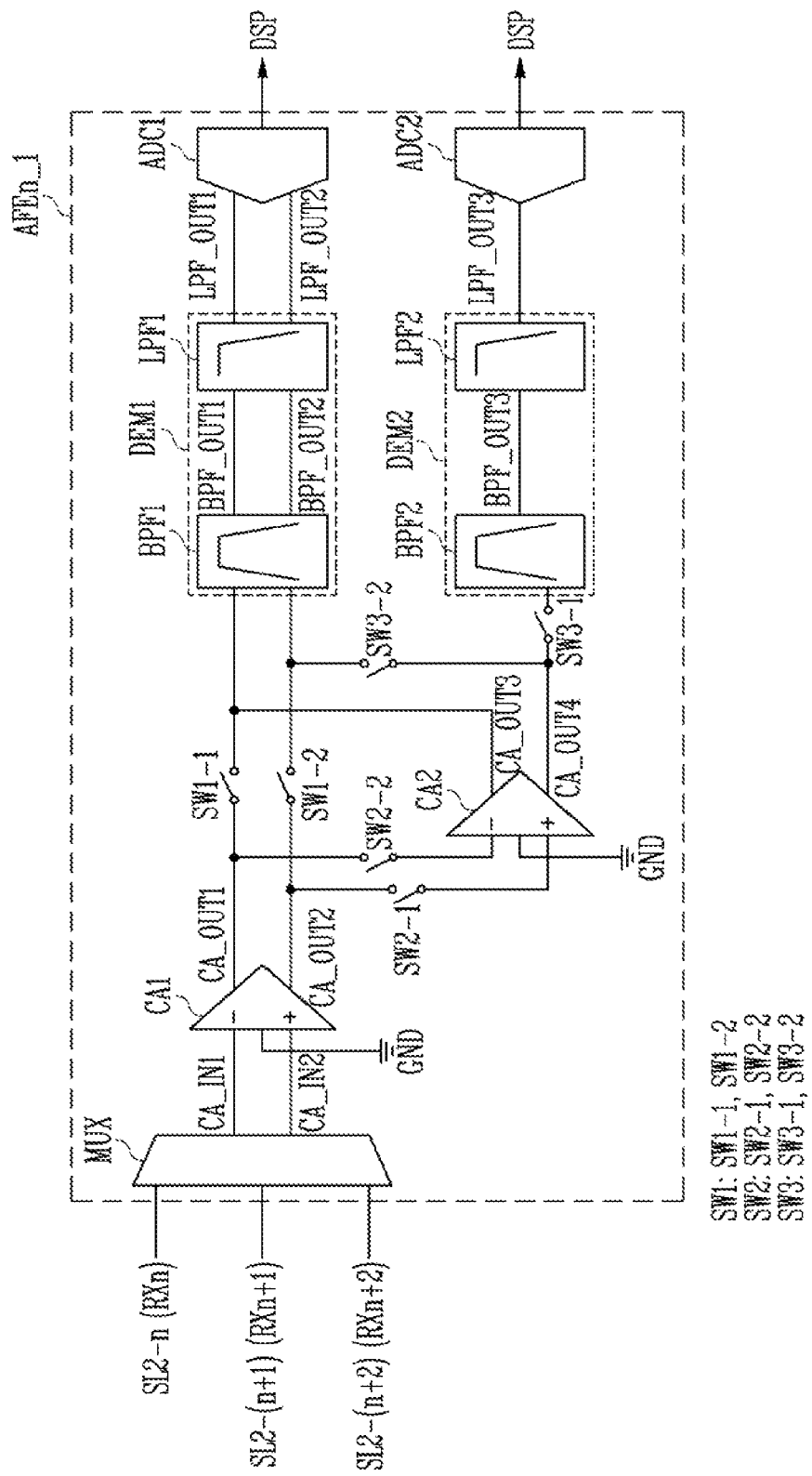
FIG. 11 is a block diagram illustrating an example of an analog front-end included in the input sensing circuit of FIG. 10, in accordance with embodiments of the present disclosure.

FIG. 11 is a block diagram illustrating an example of the analog front-end included in the input sensing circuit of FIG. 10, in accordance with embodiments of the present disclosure.

Referring to FIGS. 10 and 11, since the analog front-ends AFE1_1 and AFE2_1 are substantially the same as each other, an analog front-end AFEn_1 (where n is a positive integer) including the analog front-ends AFE1_1 and AFE2_1 will be described. For example, each of the analog front-ends AFE1_1 and AFE2_1 may be implemented with the analog front-end AFEn_1 described herein.

The analog front-end AFEn_1 may include a multiplexer MUX, a first charge amplifier CA1, a second charge amplifier CA2, first to third switching circuits SW1, SW2, and SW3, a first demodulation circuit DEM1 (or a first filter circuit), a first analog-to-digital converter ADC1, a second demodulation circuit DEM2 (or a second filter circuit), and a second analog-to-digital converter ADC2.

The multiplexer MUX may receive an n-th sensing signal RXn provided through an n-th second signal line SL2-$n$ (or n-th sensing line), an n+1-th sensing signal RXn+1 provided through an n+1-th second signal line SL2-($n$+1) (or n+1-th sensing line), and an n+2-th sensing signal RXn+2 provided through an n+2-th second signal line SL2-($n$+2) (or n+2-th sensing line) to select and output two sensing signals among the n-th sensing signal RXn, the n+1-th sensing signal RXn+1, and the n+2-th sensing signal RXn+2. Among the n-th sensing signal RXn, the n+1-th sensing signal RXn+1, and the n+2-th sensing signal RXn+2, two sensing signals may be provided to the first charge amplifier CA1 as the first and second input signals CA_IN1 and CA_IN2. The multiplexer MUX may be implemented as a multiplexer having an input/output ratio of 3:2, but is not limited thereto.

For example, in the first period, the multiplexer MUX may couple the n-th second signal line SL2-$n$ and the n+1-th second signal line SL2-($n$+1) to the input terminals of the first charge amplifier CA1, respectively, in response to a first selection signal provided from an external device (e.g., the signal processor DSP, the driving signal generator TXD). For example, in the second period, the multiplexer MUX may couple the n+1-th second signal line SL2-($n$+1) and the n+2-th second signal line SL2-($n$+2) to the input terminals of the first charge amplifier CA1, respectively, in response to a second selection signal provided from the external device.

In some embodiments, when the analog front-end AFEn-1 includes the multiplexer MUX, a total number of analog front-ends AFE1_1 and AFE2_1 in the input sensing circuit IS-C_1 may be reduced, and the integration of the input sensing circuit IS-C_1 may be more efficient. In some embodiments, the multiplexer MUX may be omitted.

The first charge amplifier CA1 may receive the first and second input signals CA_IN1 and CA_IN2 and may differentially amplify the first and second input signals CA_IN1 and CA_IN2 to output the first differential signal CA_OUT1 and the second differential signal CA_OUT2. In an embodiment, when only one of the first and second input signals CA_IN1 and CA_IN2 is provided to the first charge amplifier CA1, the first charge amplifier CA1 may amplify and output the input signal.

The second charge amplifier CA2 may receive the first and second differential signals CA_OUT1 and CA_OUT2 through a second switching circuit SW2, and may differentially amplify the first and second differential signals CA_OUT1 and CA_OUT2 to output a third differential signal CA_OUT3 (or third amplification signal) and a fourth differential signal CA_OUT4 (or fourth amplification signal). In an embodiment, when only one of the first and second differential signals CA_OUT1, CA_OUT2 is provided to the second charge amplifier CA2, the second charge amplifier CA2 may amplify and output the differential signal.

Since each of the first charge amplifier CA1 and the second charge amplifier CA2 is substantially the same as the charge amplifier CA, CA1, or CA_2 described with reference to FIGS. 9A to 9C, a duplicated description thereof will not be repeated.

The first switching circuit SW1 may be coupled between the output terminals of the first charge amplifier CA1 and the first demodulation circuit DEM1. The first switching circuit SW1 may be operated in response to a control signal provided from the external device (e.g., the signal processor DSP and the driving signal generator TXD).

The first switching circuit SW1 may include a 1-1-th switch SW1-1 (or a first switch, a first switching element) and a 1-2-th switch SW1-2 (or a second switch, a second switching element). The 1-1-th switch SW1-1 may be electrically coupled between the first output terminal (e.g., the terminal to which the first differential signal CA_OUT1 is output) of the first charge amplifier CA1 and the first input terminal of the first demodulation circuit DEM1 (or the first band pass filter BPF1). The 1-2-th switch SW1-2 may be electrically coupled between the second output terminal (e.g., the terminal to which the second differential signal CA_OUT2 is output) of the first charge amplifier CA1 and the second input terminal of the first demodulation circuit DEM1 (or the first band pass filter BPF1).

The second switching circuit SW2 may be coupled between the output terminals of the first charge amplifier CA1 and the input terminals of the second charge amplifier CA2. The second switching circuit SW2 may be operated in response to a control signal provided from the external device.

The second switching circuit SW2 may include a 2-1-th switch SW2-1 (or a third switch) and a 2-2-th switch SW2-2 (or a fourth switch). The 2-2-th switch SW2-2 may be electrically coupled between the first output terminal of the first charge amplifier CA1 and the first input terminal (e.g., the negative input terminal "−") of the second charge amplifier CA2. The 2-1-th switch SW2-1 may be electrically coupled between the second output terminal of the first charge amplifier CA1 and the second input terminal (e.g., the positive input terminal "+") of the second charge amplifier CA2.

The third switching circuit SW3 may include a 3-1-th switch SW3-1 (or a fifth switch) and a 3-2-th switch SW3-2 (or a sixth switch). The 3-1-th switch SW3-1 may be electrically coupled to the second output terminal (e.g., the terminal to which the fourth differential signal CA_OUT4 is output) of the second charge amplifier CA2 and the input terminal of the second demodulation circuit DEM2 (or the second band pass filter BPF2). The 3-2-th switch SW3-2 may be electrically coupled to the second output terminal of the second charge amplifier CA2 and the second input terminal of the first demodulation circuit DEM1 (or the first band pass filter BPF1). The third switching circuit SW3 (or the 3-1-th switch SW3-1 and the 3-2-th switch SW3-2) may be operated in response to a control signal provided from the external device.

The first output terminal (e.g., the terminal to which the third differential signal CA_OUT3 is output) of the second charge amplifier CA2 may be coupled to the first input terminal of the first demodulation circuit DEM1 (or first band pass filter BPF1).

The first demodulation circuit DEM1 may filter input signals. In other words, the first demodulation circuit DEM1 may remove noise from the input signals and extract only valid signals.

In embodiments, the first demodulation circuit DEM1 may filter the first and second differential signals CA_OUT1 and CA_OUT2 provided as input signals in the first mode, filter only the first differential signal CA_OUT1 provided as an input signal in the second mode, and filter the third and fourth differential signals CA_OUT3 and CA_OUT4 provided as input signals in the third mode.

The first demodulation circuit DEM1 may include a first band pass filter BPF1 and a first low pass filter LPF1. Since the first band pass filter BPF1 and the first low pass filter LPF1 are substantially the same as the band pass filter BPF and the low pass filter LPF described with reference to FIGS. 8B and 8C, respectively, a duplicated description thereof will not be repeated. The first demodulation circuit DEM1 may further include the mixer MX described with reference to FIG. 8C.

The first analog-to-digital converter ADC1 may receive the first output signal LPF_OUT1 and the second output signal LPF_OUT2 from the first demodulation circuit DEM1, and may provide a sensing value (or a differential output value) corresponding to a difference between the first output signal LPF_OUT1 and the second output signal LPF_OUT2 to the signal processor DSP. For example, the first analog-to-digital converter ADC1 may convert the first output signal LPF_OUT1 into a first output value, may convert the second output signal LPF_OUT2 into a second output value, and may output a sensing value by differentiating the first output value and the second output value.

The second demodulation circuit DEM2 may filter the fourth differential signal CA_OUT4. For example, the second demodulation circuit DEM2 may remove noise from the fourth differential signal CA_OUT4 provided as an input signal in the second mode and extract only a valid signal.

The second demodulation circuit DEM2 may include a second band pass filter BPF2 and a second low pass filter LPF2. The second band pass filter BPF2 and the second low pass filter LPF2 may be similar to the band pass filter BPF and the low pass filter LPF described with reference to FIGS. 8B and 8C, respectively. In an embodiment, each of the second band pass filter BPF2 and the second low pass filter LPF2 may be configured to receive only one signal, amplify only a portion corresponding to a specific frequency band, and output only one amplified signal (e.g., the third filtered signal BPF_OUT3, the third output signal LPF_OUT3). For example, each of the second band pass filter BPF2 and the second low pass filter LPF2 may be configured to include a general amplifier instead of a fully differential amplifier. However, the present disclosure is not limited thereto. For example, the second band pass filter BPF2 and the second low pass filter LPF2 may be implemented to be substantially the same as the first band pass filter BPF1 and the second low pass filter LPF2, respectively, and each of the second band pass filter BPF2 and the second low pass filter LPF2 may use only one input terminal and one output terminal.

In an embodiment, the second demodulation circuit DEM2 may further include the mixer MX described with reference to FIG. 8C.

The second analog-to-digital converter ADC2 may receive the third output signal LPF_OUT3 from the second demodulation circuit DEM2, and may provide a sensing value corresponding to the third output signal LPF_OUT3 to the signal processor DSP. The second analog-to-digital converter ADC2 may be substantially the same as the first analog-to-digital converter ADC1.

Figure 12A:
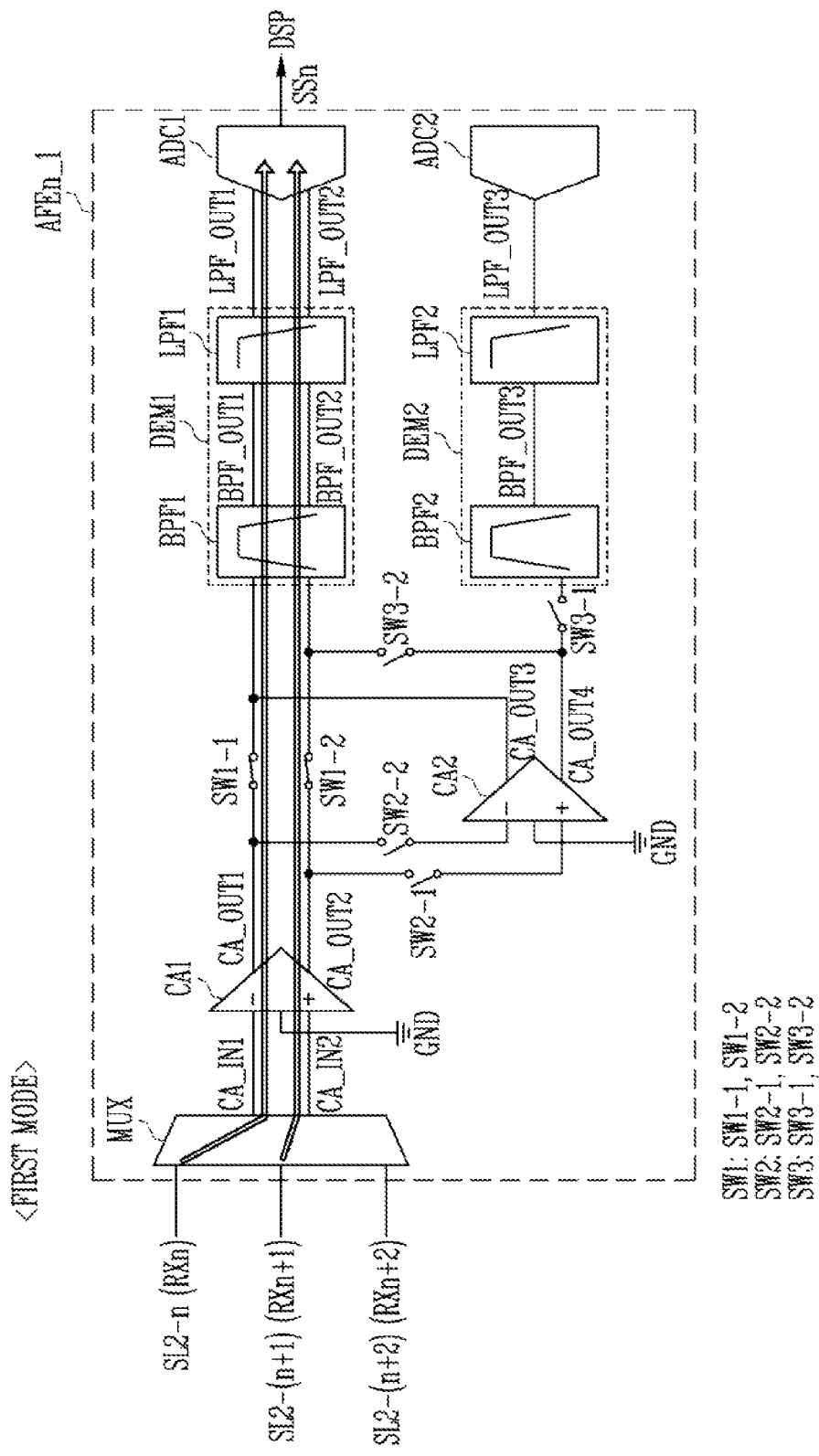
FIGS. 12A, 12B, and 12C are diagrams for explaining the operation of the analog front-end of FIG. 11, in accordance with embodiments of the present disclosure.
Figure 12B:
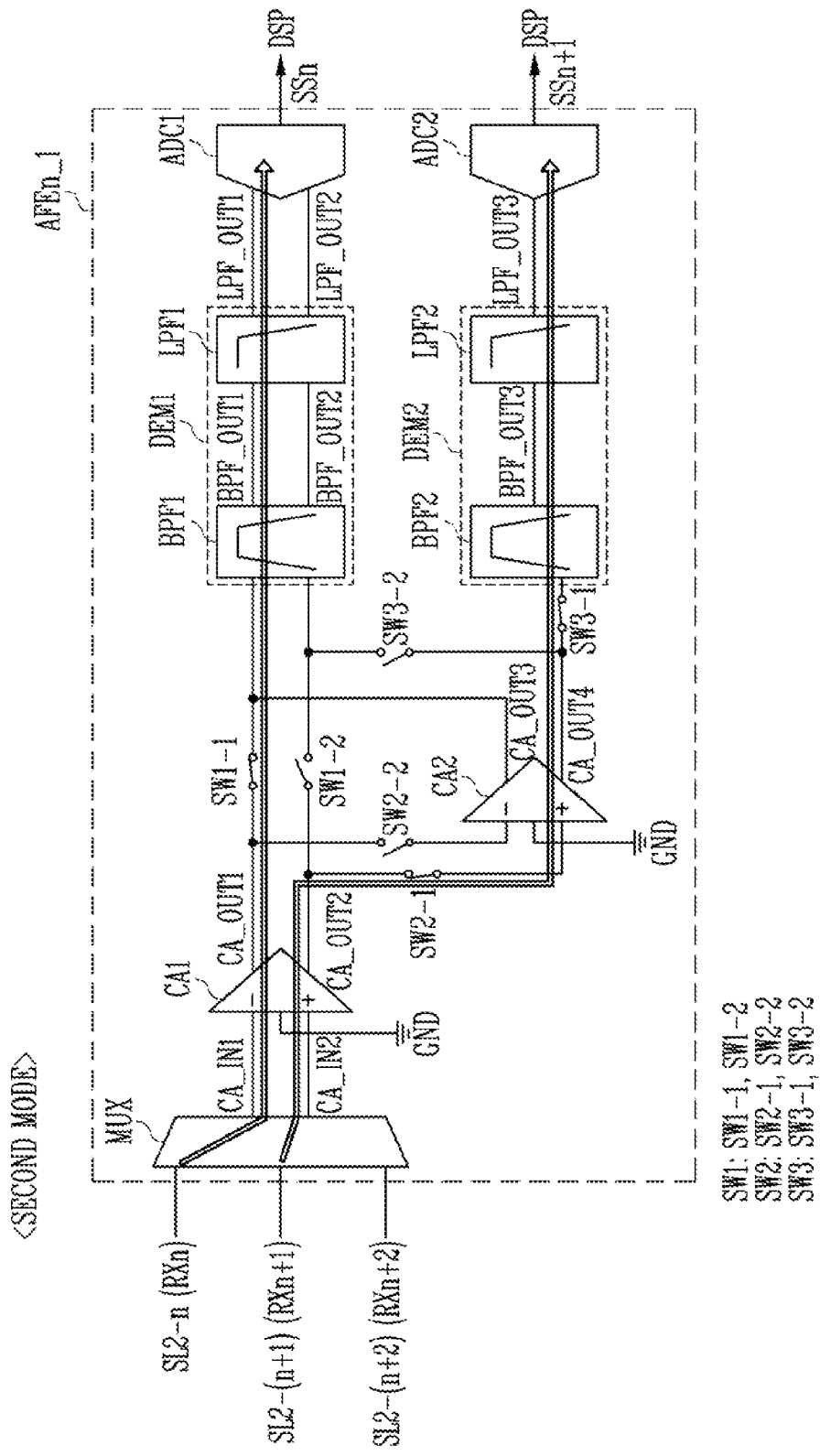
Figure 12C:
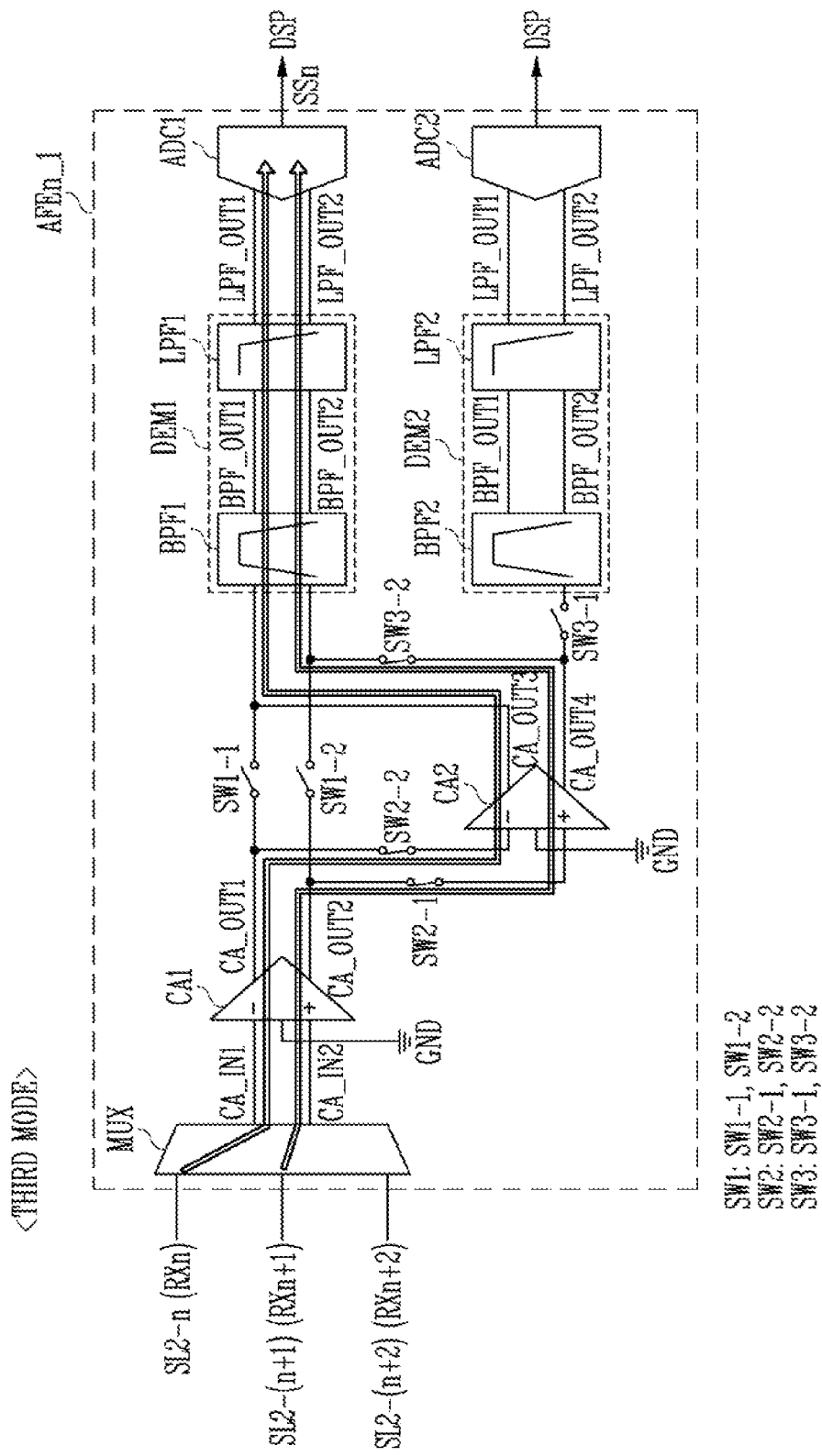

FIGS. 12A, 12B, and 12C are diagrams for explaining the operation of the analog front-end of FIG. 11, in accordance with embodiments of the present disclosure. FIG. 12A shows the operation of the analog front-end in a first mode, FIG. 12B shows the operation of the analog front-end in a second mode, and FIG. 12C shows the operation of the analog front-end in a third mode.

First, referring to FIG. 12A, in the first mode, the first switching circuit SW1, that is, the 1-1-th switch SW1-1 and the 1-2-th switch SW1-2, may be turned on. The second switching circuit SW2 and the third switching circuit SW3 may be turned off. In this case, the first and second differential signals CA_OUT1 and CA_OUT2 of the first charge amplifier CA1 may be provided to the first demodulation circuit DEM1, the first demodulation circuit DEM1 may filter the first and second differential signals CA_OUT1 and CA_OUT2, and the first analog-to-digital converter ADC1 may output an n-th sensing value SSn corresponding to the first and second differential signals CA_OUT1 and CA_OUT2. When the multiplexer MUX selects the n-th sensing signal RXn and the n+1-th sensing signal RXn+1 in the first period, the n-th sensing value SSn may correspond to a difference between the n-th sensing signal RXn and the n+1-th sensing signal RXn+1 (e.g., the difference between the sensing capacitance of the n-th second sensing electrode and the sensing capacitance of the n+1-th sensing electrode). When the multiplexer MUX selects the n+1-th sensing signal RXn+1 and the n+2-th sensing signal RXn+2 in the second period, the n-th sensing value SSn may correspond to a difference between the n+1-th sensing signal RXn+1 and the n+2-th sensing signal RXn+2 (e.g., the difference between the sensing capacitance of the n+1-th second sensing electrode and the sensing capacitance of the n+2-th sensing electrode).

Referring to FIG. 12B, in the second mode, the 1-1-th switch SW1-1, the 2-1-th switch SW2-1, and the 3-1-th switch SW3-1 may be turned on, respectively. The 1-2-th switch SW1-2, the 2-2-th switch SW2-2, and the 3-2-th switch SW3-2 may be turned off. In this case, only the first differential signal CA_OUT1 of the first charge amplifier CA1 may be provided to the first demodulation circuit DEM1, the first demodulation circuit DEM1 may filter the first differential signal CA_OUT1, and the first analog-to-digital converter ADC1 may output an n-th sensing value SSn corresponding to the first differential signal CA_OUT1. The second differential signal CA_OUT2 of the first charge amplifier CA1 may be provided to the second charge amplifier CA2, the second charge amplifier CA2 may amplify the second differential signal CA_OUT2 to output a fourth differential signal CA_OUT4, the second demodulation circuit DEM2 may filter the fourth differential signal CA_OUT4, and the second analog-to-digital converter ADC2 may output an n+1-th sensing value SSn+1 corresponding to the fourth differential signal CA_OUT4 (or the second differential signal CA_OUT2).

When the multiplexer MUX selects the n-th sensing signal RXn and the n+1-th sensing signal RXn+1, the n-th sensing value SSn may correspond to the n-th sensing signal RXn, and the n+1-th sensing value SSn+1 may correspond to the n+1-th sensing signal RXn+1. For example, when each of the first charge amplifier CA1 and the second charge amplifier CA2 has a structure that is substantially the same as that of the charge amplifier CA_2 described with reference to FIG. 9C, the first charge amplifier CA1, the first demodulation circuit DEM1, and the first analog-to-digital converter ADC1 may form a first single analog front-end (e.g., the analog front-end AFEn_C, see FIG. 8A), and the second charge amplifier CA2, the second demodulation circuit DEM2, and the second analog-to-digital converter ADC2 may form a second single analog front-end. Therefore, the analog front-end AFEn_1 may operate identically or similarly to the analog front-end AFEn_C described with reference to FIG. 8A, the n-th sensing value SSn may represent the absolute value of the n-th sensing signal RXn (e.g., the sensing capacitance of the n-th second sensing electrode), and the n+1-th sensing value SSn+1 may represent an absolute value of the n+1-th sensing signal RXn+1 (e.g., the sensing capacitance of the n+1-th second sensing electrode). An inspection may be performed on the input sensing unit ISU based on the absolute values of the sensing capacitances.

Referring to FIG. 12C, in the third mode, the 2-1-th switch SW2-1, the 2-2-th switch SW2-2, and the 3-2-th switch SW3-2 may be turned on. The 1-1-th switch SW1-1, the 1-2-th switch SW1-2, and the 3-1-th switch SW3-1 may be turned off. In this case, the first and second differential signals CA_OUT1 and CA_OUT2 of the first charge amplifier CA1 may be provided to the second charge amplifier CA2, the second charge amplifier CA2 may differentially amplify the first and second differential signals CA_OUT1 and CA_OUT2 to provide the third and fourth differential signals CA_OUT3 and CA_OUT4 to the first demodulation circuit DEM1, the first demodulation circuit DEM1 may filter the third and fourth differential signals CA_OUT3 and CA_OUT4, and the first analog-to-digital converter ADC1 may output an n-th sensing value SSn corresponding to the third and fourth differential signals CA_OUT3 and CA_OUT4. Compared with the first mode, the n-th sensing signal RXn and the n+1-th sensing signal RXn+1 may be amplified (or differentially amplified) by the first charge amplifier CA1 as well as the second charge amplifier CA2, and an n-th sensing value SSn corresponding to a difference between the n-th sensing signal RXn and the n+1-th sensing signal RXn+1 (e.g., the difference between the sensing capacitance of the n-th second sensing electrode and the sensing capacitance of the n+1-th sensing electrode) may be increased. Thus, even in the case of non-contact input including, e.g., hovering over the display device DD without making physical contact with the display device DD, or an external input having a small touch area such as a pen, in other words, even when the magnitude of a sensing signal is small or a larger sensing signal is required, the external input may be precisely sensed according to embodiments of the present disclosure.

As described above, the analog front-end AFEn_1 may differentially amplify adjacent sensing signals using the first charge amplifier CA1 and remove noise from the sensing signals using the first charge amplifier CA1 and the first demodulation circuit DEM1, thus increasing sensing sensitivity even in an environment in which the input sensing unit ISU deteriorates (e.g., an environment resulting from high-speed driving, thinning, and enlargement of the display device DD).

Further, the analog front-end AFEn_1 may form a first single analog front-end composed of the first charge amplifier CA1 and the first demodulation circuit DEM1, and may form a second single analog front-end composed of the second charge amplifier CA2 and the second demodulation circuit DEM2, thus measuring the absolute values of the sensing signals (or sensing capacitances). Therefore, embodiments of the present disclosure allow for the input sensing unit ISU to be inspected (e.g., allow for the measuring of the sensing capacitance and parasitic capacitance of a specific second sensing electrode).

Moreover, the analog front-end AFEn_1 may more greatly amplify the sensing signals using the first charge amplifier CA1 and the second charge amplifier CA2, thus, further increasing sensing sensitivity.

Although FIGS. 11 and 12A to 12C show that the analog front-end AFEn_1 includes only the first charge amplifier CA1 and the second charge amplifier CA2, e.g., only the charge amplifiers of two stages, the analog front-end AFEn_1 is not limited thereto. For example, in an embodiment, the analog front-end AFEn_1 may be configured or modified to include charge amplifiers of three or more stages which are coupled in series.

Figure 13:
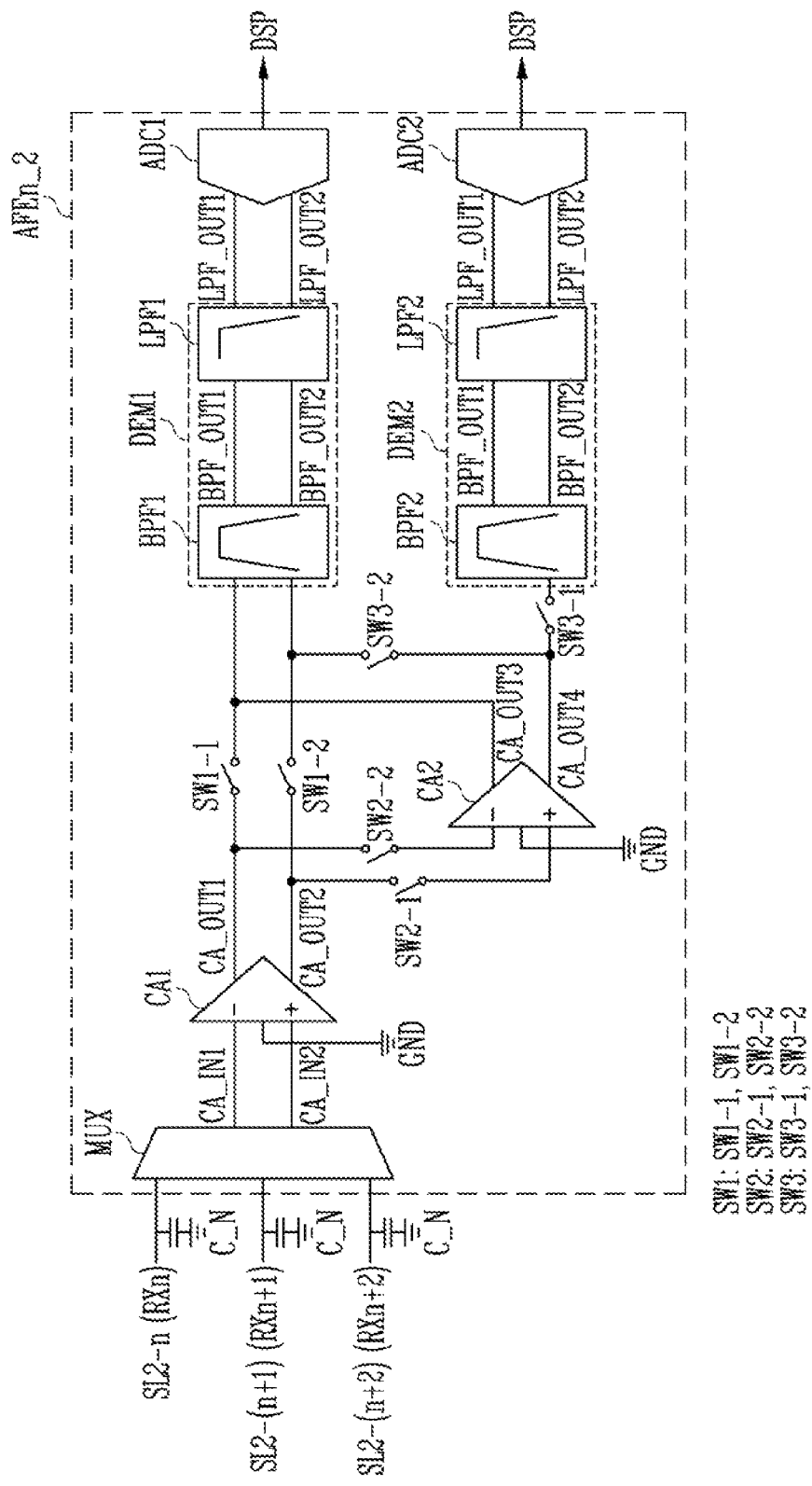
FIG. 13 is a block diagram illustrating an example of an analog front-end included in the input sensing circuit of FIG. 10, in accordance with embodiments of the present disclosure.

FIG. 13 is a block diagram illustrating an example of an analog front-end included in the input sensing circuit of FIG. 10, in accordance with embodiments of the present disclosure.

Referring to FIGS. 11 and 13, the analog front-end AFEn_2 is different from the analog front-end AFEn_1 of FIG. 11 in that it further includes a negative capacitor C_N. Since the analog front-end AFEn_2 is substantially the same as the analog front-end AFEn_1 of FIG. 11 except for the negative capacitor C_N, a duplicated description of components and technical aspects previously described will not be repeated for convenience of explanation.

The negative capacitor C_N (or negative capacitor circuit or parasitic capacitance compensating circuit) may be respectively coupled to the input terminals of the multiplexer MUX or may be formed on each of the second signal lines.

For example, the negative capacitor C_N may be coupled to a first input terminal of the multiplexer MUX or an n-th second signal line SL2-$n$ (or an n-th sensing line). Further, other negative capacitors C_N may be coupled to the second input terminal of the multiplexer MUX (or the n+1-th second signal line SL2-($n$+1), the n+1-th sensing line), and the third input terminal of the multiplexer MUX (or the n+2-th second signal line SL2-($n$+2), the n+2-th sensing line).

For reference, as described with reference to FIG. 5, as the thickness T1 of the thin-film encapsulation layer TFE (or the encapsulation organic layer OL) decreases, a distance between the sensing electrodes in the input sensing unit ISU and the second electrode CE (or common electrode) of the light emitting element OLED may be reduced, and a parasitic capacitance formed therebetween may be increased. Further, in an embodiment in which the display device DD has a large area, an overlapping area between the sensing electrodes in the input sensing unit ISU and the second electrode CE of the light emitting element OLED may be increased, and the parasitic capacitance may be increased. The parasitic capacitance may cause response delay of the driving signal and the sensing signal, and may reduce sensing sensitivity.

The negative capacitor C_N may be implemented as a negative capacitor field effect transistor (FET). The negative capacitor may be discharged when the voltage of a corresponding line increases, and may be charged when the voltage of the corresponding line decreases. Thereby, the negative capacitor C_N may offset the parasitic capacitance.

As described with reference to FIG. 13, the analog front-end AFEn_2 may reduce the parasitic capacitance for the sensing electrodes in the input sensing unit using the negative capacitor C_N. Therefore, sensing sensitivity may be increased.

Figure 14:
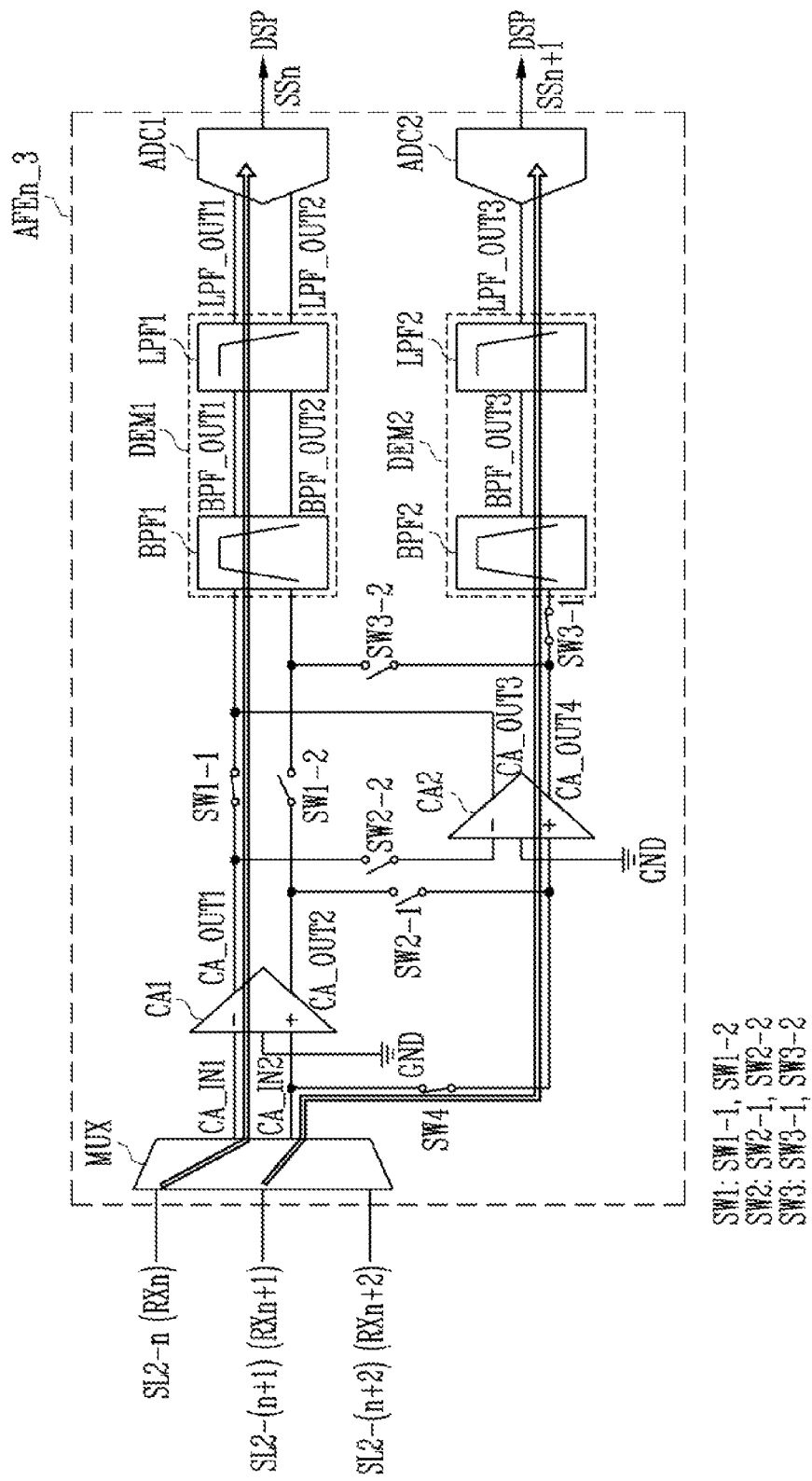
FIG. 14 is a block diagram illustrating an example of the analog front-end included in the input sensing circuit of FIG. 10, in accordance with embodiments of the present disclosure.

Although FIG. 13 shows that the analog front-end AFEn_2 includes the multiplexer MUX, the present disclosure is not limited thereto. For example, FIG. 14 is a block diagram illustrating an example of the analog front-end included in the input sensing circuit of FIG. 6A. As shown in FIG. 14, a negative capacitor C_N may be applied to the analog front-end AFEn described with reference to FIGS. 8A, 8B and 8C.

FIG. 14 is a block diagram illustrating an example of the analog front-end included in the input sensing circuit of FIG. 10, in accordance with embodiments of the present disclosure.

Referring to FIGS. 11, 12A to 12C, and 14, the analog front-end AFEn_3 is different from the analog front-end AFEn_1 of FIG. 11 in that it further includes a fourth switching circuit SW4 (or a seventh switch). Since the analog front-end AFEn_3 is substantially the same as the analog front-end AFEn_1 of FIG. 11 except for the fourth switching circuit SW4, a duplicated description of components and technical aspects previously described will not be repeated for convenience of explanation.

The fourth switching circuit SW4 may be coupled between the second output terminal of the multiplexer MUX (e.g., the terminal to which the second input signal CA_IN1 is output) and the second input terminal of the second charge amplifier CA2 (e.g., an input terminal coupled to the 2-1-th switch SW2-1 or a positive input terminal "+"). The fourth switching circuit SW4 may be operated in response to a control signal provided from the external device (e.g., the signal processor DSP and the driving signal generator TXD).

In the first mode and the third mode, the fourth switching circuit SW4 may be turned off. In this case, the analog front-end AFEn_3 may be operated substantially in the same manner as the analog front-end AFEn_1 described with reference to FIGS. 12A and 12C.

In the second mode, the fourth switching circuit SW4 may be turned on. Based on the analog front-end AFEn_1 of FIG. 12B, the 2-1-th switch SW2-1 may be turned off. In this case, the second input signal CA_IN2 may be provided to the second charge amplifier CA2, the second charge amplifier CA2 may amplify the second input signal CA_IN2 to output a fourth differential signal CA_OUT4, the second demodulation circuit DEM2 may filter the fourth differential signal CA_OUT4, and the second analog-to-digital converter ADC2 may output an n+1-th sensing value SSn+1 corresponding to the fourth differential signal CA_OUT4. As described with reference to FIG. 12B, the first charge amplifier CA1 may amplify the first input signal CA_IN1 to output the first differential signal CA_OUT1, only the first differential signal CA_OUT1 of the first charge amplifier CA1 may be provided to the first demodulation circuit DEM1, the first demodulation circuit DEM1 may filter the first differential signal CA_OUT1, and the first analog-to-digital converter ADC1 may output an n-th sensing value SSn corresponding to the first differential signal CA_OUT1.

The first charge amplifier CA1, the first demodulation circuit DEM1, and the first analog-to-digital converter ADC1 may form a first single analog front-end (e.g., the analog front-end AFEn_C (see FIG. 8A)), the second charge amplifier CA2, the second demodulation circuit DEM2, and the second analog-to-digital converter ADC2 may form a second single analog front-end, and the second single analog front-end may be independent from the first single analog front-end.

Since the n-th sensing value SSn represents the absolute value of the n-th sensing signal RXn (e.g., the sensing capacitance of the n-th second sensing electrode), and the n+1-th sensing value SSn+1 represents the absolute value of the n+1-th sensing signal RXn+1 (e.g., the sensing capacitance of the n+1-th second sensing electrode), an inspection may be performed on the input sensing unit ISU based on the absolute values of the sensing capacitances.

In an embodiment, the negative capacitor C_N described with reference to FIG. 13 may be applied to the analog front-end AFEn_3.

Embodiments of the present disclosure provide an input sensing device and a display device, which differentially amplify adjacent sensing signals using a first charge amplifier of an analog front-end and remove noise from sensing signals using a first demodulation circuit, thus, increasing sensing sensitivity even in an environment in which the input sensing device deteriorates (e.g., high-speed driving, thinning, and enlargement of the display device).

Further, embodiments of the present disclosure provide an input sensing device and a display device, which measure absolute values of sensing signals (or sensing capacitances) using a first charge amplifier, a first demodulation circuit, a second charge amplifier, and a second demodulation circuit, thus enabling the inspection of an input sensing unit (e.g., measurement of sensing capacitance and parasitic capacitance of a specific sensing electrode).

Furthermore, embodiments of the present disclosure provide an input sensing device and a display device, which greatly amplify sensing signals using first and second charge amplifiers of an analog front-end, e.g., charge amplifiers of two or more stages coupled in series, thus further, increasing sensing sensitivity.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. An input sensing device, comprising:
   a plurality of driving electrodes;
   a plurality of sensing electrodes;
   an analog front-end configured to output a differential output value by processing sensing signals provided from the sensing electrodes; and
   a signal processor configured to sense an external input based on the differential output value,
   wherein the analog front-end comprises:
      a first charge amplifier configured to output a first differential signal and a second differential signal through first and second output terminals of the first charge amplifier by differentially amplifying a first sensing signal and a second sensing signal provided from two sensing electrodes among the sensing electrodes to first and second input terminals of the first charge amplifier;
      a second charge amplifier configured to output a third differential signal and a fourth differential signal by differentially amplifying the first differential signal and the second differential signal;
      a first demodulation circuit configured to filter each of the first and second differential signals in a first mode, and to filter each of the third and fourth differential signals in a second mode; and
      a first analog-to-digital converter configured to output a first sensing value based on at least one output signal of the first demodulation circuit.

2. The input sensing device according to claim 1, wherein the analog front-end further comprises:
   a first switching component coupled between the first and second output terminals of the first charge amplifier and the first demodulation circuit, and configured to be turned on in the first mode; and
   a second switching component coupled between the first and second output terminals of the first charge amplifier and third and fourth input terminals of the second charge amplifier, and configured to be turned on in the second mode.

3. The input sensing device according to claim 2, wherein the first switching component comprises:
   a first switch coupled between the first output terminal of the first charge amplifier and a first input terminal of the first demodulation circuit; and
   a second switch coupled between the second output terminal of the first charge amplifier and a second input terminal of the first demodulation circuit.

4. The input sensing device according to claim 3, wherein the second switching component comprises:

a third switch coupled between the first output terminal of the first charge amplifier and a first input terminal of the second charge amplifier; and
a fourth switch coupled between the second output terminal of the first charge amplifier and a second input terminal of the second charge amplifier.

5. The input sensing device according to claim 2, wherein the analog front-end further comprises:
   a second demodulation circuit configured to filter one of outputs of the second charge amplifier in a third mode; and
   a second analog-to-digital converter configured to output a second sensing value corresponding to an output signal of the second demodulation circuit, and
   wherein the second output terminal of the first charge amplifier is coupled to the second charge amplifier through the second switching component in the third mode.

6. The input sensing device according to claim 5, wherein the analog front-end further comprises:
   a fifth switch coupled between a second output terminal of the second charge amplifier and the second demodulation circuit, and configured to be turned on in the third mode; and
   a sixth switch coupled between the second output terminal of the second charge amplifier and the first demodulation circuit, and configured to be turned on in the second mode and turned off in the third mode.

7. The input sensing device according to claim 6, wherein, in the third mode,
   the first output terminal of the first charge amplifier is coupled to a first input terminal of the first demodulation circuit through the first switching component,
   the first demodulation circuit filters the first differential signal, and
   the first analog-to-digital converter outputs the first sensing value corresponding to the filtered first differential signal.

8. The input sensing device according to claim 5, wherein the analog front-end further comprises:
   a multiplexer configured to select two of three sensing electrodes adjacent to each other among the sensing electrodes and couple the selected sensing electrodes to the first and second input terminals of the first charge amplifier.

9. The input sensing device according to claim 2, wherein the analog front-end further comprises:
   a second demodulation circuit configured to filter one of outputs of the second charge amplifier in a third mode;
   a second analog-to-digital converter configured to output a second sensing value corresponding to an output signal of the second demodulation circuit; and
   a fourth switching component configured to couple one of the two sensing electrodes to one of the third and fourth input terminals of the second charge amplifier, in the third mode.

10. The input sensing device according to claim 9, wherein, in the third mode,
    the second switching component is turned off,
    the first output terminal of the first charge amplifier is coupled to a first input terminal of the first demodulation circuit through the first switching component,
    the first demodulation circuit filters the first differential signal, and
    the first analog-to-digital converter outputs the first sensing value corresponding to the filtered first differential signal.

11. An input sensing device, comprising:
a plurality of driving electrodes;
a plurality of sensing electrodes;
an analog front-end configured to output a differential output value by processing sensing signals provided from the sensing electrodes; and
a signal processor configured to sense an external input based on the differential output value,
wherein the analog front-end comprises:
a first charge amplifier configured to output a first differential signal and a second differential signal through first and second output terminals of the first charge amplifier by differentially amplifying a first sensing signal and a second sensing signal provided from two sensing electrodes among the sensing electrodes to first and second input terminals of the first charge amplifier;
a first demodulation circuit configured to filter each of the first and second differential signals in a first mode, and to filter the first differential signal in a second mode;
a first analog-to-digital converter configured to output a first sensing value based on output signals of the first demodulation circuit; and
a second analog-to-digital converter configured to output a second sensing value corresponding to the second differential signal in the second mode.

12. The input sensing device according to claim 11, wherein the first analog-to-digital converter outputs the first sensing value corresponding to a difference between the first and second differential signals in the first mode, and outputs the first sensing value corresponding to the first differential signal in the second mode.

13. The input sensing device according to claim 12, wherein,
the analog front-end further comprises a second charge amplifier configured to amplify and output the second differential signal in the second mode, and
the second analog-to-digital converter outputs the second sensing value corresponding to an output of the second charge amplifier.

14. The input sensing device according to claim 13, wherein,
the analog front-end further comprises a second demodulation circuit configured to filter the output of the second charge amplifier, and
the second analog-to-digital converter outputs the second sensing value corresponding to an output of the second demodulation circuit.

15. A display device, comprising:
a display panel comprising a plurality of light-emitting pixels;
a plurality of driving electrodes disposed on a surface of the display panel;
a plurality of sensing electrodes disposed on the surface of the display panel;
an analog front-end configured to output a differential output value by processing sensing signals provided from the sensing electrodes; and
a signal processor configured to sense an external input based on the differential output value,
wherein the analog front-end comprises:
a first charge amplifier configured to output a first differential signal and a second differential signal through first and second output terminals of the first charge amplifier by differentially amplifying a first sensing signal and a second sensing signal provided from two sensing electrodes among the sensing electrodes to first and second input terminals of the first charge amplifier;
a second charge amplifier configured to output a third differential signal and a fourth differential signal by differentially amplifying the first differential signal and the second differential signal;
a first demodulation circuit configured to filter each of the first and second differential signals in a first mode, and to filter each of the third and fourth differential signals in a second mode; and
a first analog-to-digital converter configured to output a first sensing value based on at least one output signal of the first demodulation circuit.

16. The display device according to claim 15, wherein the display panel further comprises:
a base layer;
a light emitting element formed on the base layer and forming each of the light-emitting pixels; and
a thin-film encapsulation layer covering the light emitting element, and
wherein the driving electrodes or the sensing electrodes are directly formed on the thin-film encapsulation layer.

17. The display device according to claim 16, wherein the analog front-end further comprises:
a first switching component coupled between the first and second output terminals of the first charge amplifier and the first demodulation circuit, and configured to be turned on in the first mode; and
a second switching component coupled between the first and second output terminals of the first charge amplifier and third and fourth input terminals of the second charge amplifier, and configured to be turned on in the second mode.

18. The display device according to claim 17, wherein the analog front-end further comprises:
a second demodulation circuit configured to filter one of outputs of the second charge amplifier in a third mode; and
a second analog-to-digital converter configured to output a second sensing value corresponding to an output signal of the second demodulation circuit, and
wherein the second output terminal of the first charge amplifier is coupled to the second charge amplifier through the second switching component in the third mode.

19. The display device according to claim 18, wherein the analog front-end further comprises:
a multiplexer configured to select two of three sensing electrodes adjacent to each other among the sensing electrodes and couple the selected sensing electrodes to the first and second input terminals of the first charge amplifier.

20. The display device according to claim 17, wherein the analog front-end further comprises:
a second demodulation circuit configured to filter one of outputs of the second charge amplifier in a third mode;
a second analog-to-digital converter configured to output a second sensing value corresponding to an output signal of the second demodulation circuit; and
a third switching component configured to couple one of the two sensing electrodes to one of the third and fourth input terminals of the second charge amplifier, in the third mode.

* * * * *